(12) United States Patent
Kamisaka et al.

(10) Patent No.: US 12,315,565 B2
(45) Date of Patent: May 27, 2025

(54) THREE-DIMENSIONAL MEMORY STRUCTURE FABRICATED USING REPEATED ACTIVE STACK SECTIONS

(71) Applicant: SUNRISE MEMORY CORPORATION, San Jose, CA (US)

(72) Inventors: Shohei Kamisaka, Kanagawa (JP); Vinod Purayath, Sedona, AZ (US); Jie Zhou, San Jose, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 417 days.

(21) Appl. No.: 17/730,056

(22) Filed: Apr. 26, 2022

(65) Prior Publication Data

US 2022/0383953 A1    Dec. 1, 2022

Related U.S. Application Data

(60) Provisional application No. 63/194,006, filed on May 27, 2021.

(51) Int. Cl.

| | | |
|---|---|---|
| *G11C 16/04* | (2006.01) | |
| *H10B 41/27* | (2023.01) | |
| *H10B 43/27* | (2023.01) | |
| *H10D 30/01* | (2025.01) | |
| *H10D 30/67* | (2025.01) | |

(52) U.S. Cl.
CPC ......... *G11C 16/0483* (2013.01); *H10B 41/27* (2023.02); *H10B 43/27* (2023.02); *H10D 30/031* (2025.01); *H10D 30/6755* (2025.01); *H10D 30/6757* (2025.01)

(58) Field of Classification Search
CPC ............ H10B 41/00–70; H01L 29/792; G11C 16/0408–0458; G11C 16/0483; G11C 11/5621–5642
See application file for complete search history.

(56) References Cited

U.S. PATENT DOCUMENTS

| | | | |
|---|---|---|---|
| 10,121,553 B2 | 11/2018 | Harari | |
| 2017/0092370 A1* | 3/2017 | Harari | ................ H10D 30/693 |
| 2019/0378579 A1* | 12/2019 | Zhao | ................ G11C 16/3459 |
| 2020/0303024 A1 | 9/2020 | Harari | |
| 2022/0028876 A1 | 1/2022 | Purayath et al. | |
| 2022/0028886 A1 | 1/2022 | Purayath et al. | |

\* cited by examiner

*Primary Examiner* — Evren Seven
*Assistant Examiner* — Cole Leon Lindsey

(57) ABSTRACT

A method for forming a three-dimensional memory structure above a semiconductor substrate includes forming two or more active stack sections, each formed on top of each other and separated by a dielectric buffer layer, where each active stack section includes multilayers separated by isolation dielectric layers and trenches with shafts filled with a sacrificial material. After the multiple active stack sections are formed, the method removes the sacrificial material in the shafts and removes portions of the dielectric buffer layer between shafts of adjacent active stack sections. The method fills the openings with a gate dielectric layer and a gate conductor. In some embodiments, the gate dielectric layer is discontinuous in the shaft over the depth of the multiple active stack sections.

21 Claims, 21 Drawing Sheets

THREE-DIMENSIONAL MEMORY STRUCTURE FABRICATED USING REPEATED ACTIVE STACK SECTIONS

CROSS REFERENCE TO RELATED APPLICATIONS

The present application claims priority to U.S. Provisional Patent Application No. 63/194,006, entitled THREE-DIMENSIONAL MEMORY STACK FABRICATED USING SEGMENTED STACKS, filed on May 27, 2021, which is incorporated herein by reference for all purposes.

The present application is also related to U.S. patent application ("patent application I"), Ser. No. 17/382,064, entitled "Methods For Fabricating A 3-Dimensional Memory Structure Of NOR Memory Strings," filed on Jul. 21, 2021; U.S. provisional ("patent application II"), Ser. No. 17/382,126, entitled "Methods for Fabricating A 3-Dimensional Memory Structure of NOR Memory Strings," filed on Jul. 21, 2021; and U.S. patent application ("patent application III"), Ser. No. 16/894,596, entitled "Capacitive-Coupled Non-Volatile Thin-Film Transistor Strings in Three Dimensional Arrays," filed on Jun. 5, 2020. The disclosures of the patent applications I, II, and III are hereby incorporated by reference in their entireties.

FIELD OF THE INVENTION

The present invention relates to manufacturing processes for integrated circuits. In particular, the present invention relates to fabrication processes for forming NOR-type memory strings in a 3-dimensional semiconductor structure.

BACKGROUND OF THE INVENTION

Thin-film storage transistors organized as 3-dimensional arrays of NOR memory strings are disclosed, for example, in U.S. Pat. No. 10,121,553 (the '553 patent), entitled "Capacitive-Coupled Non-Volatile Thin-film Transistor NOR Strings in Three-Dimensional Arrays," issued on Nov. 6, 2018. The '553 patent is hereby incorporated by reference in its entirety for all purposes. Briefly, in one implementation of a 3-dimensional array of NOR memory strings, the 3-dimensional array is formed out of thin films that are successively deposited over a planar surface of semiconductor substrate. The thin films may include a number (e.g., 2, 4, 8, 16 . . . ) of groups of thin films (hereinafter, each group of thin films being referred to as an "active layer"), each active layer being provided one on top of another and being separated from the other by an isolation dielectric layer (e.g., silicon oxycarbide (SiOC)). Each active layer is a multilayer that includes a predetermined combination of various semiconductor, conductive and dielectric materials. For example, in the '533 patent, each active layer includes first and second doped semiconductor layers (e.g., $n^+$ polysilicon) separated by a dielectric layer (e.g., silicon oxide). The active layer may also include one or more conductive layers (e.g., titanium nitride (TiN)-lined tungsten (W)), or sacrificial layers (e.g., silicon nitride) to be subsequently replaced by conductive layers. In that arrangement, the conductive layers each contact one of the semiconductor layers to provide a signal path of reduced resistivity in the adjacent semiconductor layer it contacts.

After their depositions, the thin films are then cut by the manufacturing process (e.g., by one or more etching steps) to provide narrow trenches that extend lengthwise along a direction substantially parallel to the planar surface (hereinafter, a direction that is parallel to the planar surface is referred to as a "horizontal" direction). These trenches have a depth that extends "vertically" (i.e., along a direction normal to the planar surface) through all or almost all of the thin films, thereby dividing each active layer into narrow strips ("active strips") stacked one on top of another. These stacks of active strips ("active stacks") are separated from each other by the trenches along a direction orthogonal to both the vertical direction and the lengthwise direction of the active strips.

Subsequent processing steps form the NOR memory strings from the active strips. Specifically, as provided in the '533 patent, the subsequent processing steps form channel regions (e.g., $p^-$ polysilicon), charge-storage layers (e.g., oxide-nitride-oxide (ONO) multilayers) and gate electrodes (e.g., TiN-lined W). In the '533 patent, each gate electrode extends lengthwise in the vertical direction over the depth of the trench. The semiconductor layers of each active strip provide a source region ("common source line") and a drain region ("common bit line") to the storage transistors along one or both sides of the active strip. A storage transistor is formed by the common source line, the common bit line, a channel region in contact with both the common source line and the common bit line, a gate electrode and the portion of a charge-storage layer that is situated between the gate electrode and the channel region. The gate electrodes are also referred to herein as "local word lines." Along each active strip, the storage transistors that share the common source line and the common bit line form a NOR memory string (referred herein as a "Horizontal NOR memory string" or "HNOR memory string").

FIG. 1, which includes FIG. 1(a), illustrates an exemplary memory structure including a three-dimensional array of NOR memory string in some examples, which can be built using the process described above. Referring to FIG. 1, a memory structure 10 includes a number of active layers 16 formed on a planar surface of a semiconductor substrate 12. An insulation layer 14, such as a buffer oxide layer, may be provided between the semiconductor substrate 12 and the active layers 16 formed on the substrate. The active layers 16 are formed one on top of another in the Z-direction (i.e., along a direction normal to the planar surface of the substrate 12) and separated from each other by an isolation dielectric layer 15, such as a silicon oxycarbide (SiOC) layer. The active layers 16 are divided in the X-direction into narrow strips ("active strips") 17 that are stacked one on top of another to form stacks of active strips ("active stacks") extending in the Y-direction.

Each active layer 16 includes first and second doped semiconductor layers (e.g., $n^+$ polysilicon or heavily doped n-type polysilicon) separated by a dielectric layer (e.g., silicon oxide). Each active layer 16 may include one or more conductive layers (e.g., titanium nitride (TiN)-lined tungsten (W)). Each conductive layer is formed adjacent one of the doped semiconductor layers to reduce the resistivity of the doped semiconductor layer it contacts. During intermediate processing steps, the active layer may include sacrificial layers (e.g., silicon nitride) to be subsequently replaced by conductive layers. Subsequent processing steps form the channel regions (e.g., $p^-$ polysilicon or lightly doped p-type polysilicon), the charge-storage layers (e.g., oxide-nitride-oxide (ONO) multilayers) and the gate electrodes (e.g., TiN-lined W) in narrow trenches between the separated active stacks. The gate electrodes and the charge-storage layers are formed as columnar structures extending in the Z-direction. In the present example, the charge-storage layer encircles the gate electrode in the columnar structure. In the present description, the gate electrodes are also referred to as "local word lines" and a gate electrode encircled by a charge-storage layer is collectively referred to as a local word line (LWL) structure 18. The first and second doped semiconductor layers of each active strip form a source region ("common source line") and a drain region ("common bit line") of the storage transistors which may be formed along one or both sides of the active strip 17. In particular, a storage transistor 20 is formed at the intersection of an active strip 17 with the channel region and an LWL structure 18. In the present illustration, the LWL structures 18 are formed staggered in adjacent trenches bordering an active strip so that storage transistors formed on both sides of an active strip are offset from each other in the Y-direction along the memory string.

FIG. 1(a) illustrates the detail construction of a storage transistor 20 formed in the memory structure 10. Referring to FIG. 1(a), the storage transistor 20 is formed by the first doped semiconductor layer 24 forming the source region (the common source line), the second doped semiconductor layer 22 forming the drain region (the common bit line), the channel region 26 in contact with both the source region 24 and the drain region 22, the gate electrode 28 and the portion of the charge-storage layer 27 that is situated between the gate electrode 28 and the channel region 26. A conductive layer 21 contacts the second doped semiconductor layer 22 forming the common bit line and a conductive layer 25 contacts the first doped semiconductor layer 24 forming the common source line. Each storage transistor 20 is isolated from adjacent storage transistors along an active stack (in the Z-direction) by the isolation dielectric layer 15. As thus configured, along each active strip (in the Y-direction), the storage transistors that share the common source line and the common bit line form a NOR memory string (referred herein as a "Horizontal NOR memory string" or "HNOR memory string").

To complete the memory circuit, various types of circuits are formed in or at the surface of the semiconductor substrate 12 to support the operations of the HNOR memory strings. Such circuits are referred to as "circuits under array" ("CuAs") and may include various voltage sources for power supply, ground, programming, erase or read voltages, sense amplifiers, various latches and registers, various logic circuits, and various analog circuits, as described above.

As shown in FIG. 1, the memory structure 10 includes multiple active layers 16 stacked in the Z-direction, with each active layer 16 include multiple semiconductor layers. When a large number of active layers are used, the resulting stack can be exceedingly tall, making it challenging to anisotropically etch narrow trenches all the way down to the bottommost active layer of the memory structure. FIG. 2 is a cross-sectional view of a memory structure including a tall vertical stack in some examples. The cross-sectional view of FIG. 2 is taken along the X-Z plane of the memory structure. Referring to FIG. 2, a memory structure 40 is formed by a K-layer active stack including K number of active layers 16 formed over a semiconductor substrate 12 with an insulation layer 14 (such as a buffer oxide layer) formed thereon. In the present example, the active stack includes eight active layers 16. The eight-layer active stack is capped by an isolation dielectric layer 29. The memory structure 40 includes LWL structures 18 formed staggered in the narrow trenches between the active strips cut into the active layers. The gate electrode of each LWL structure 18 is the local word line which is connected to a conductive layer 30 forming the global word line. As thus configured, the resulting vertical stack of active layers can be as tall as 2 µm. The tall active layer stack presents a challenge to anisotropically etch all the way down to the bottommost active layer in order to form the narrow trenches for the LWL structures. Very high aspect ratio dry etch to form the LWL structures creates difficult processing conditions and may lead to incomplete opening at the bottommost active layer. Furthermore, the resulting tall and narrow stacks may be mechanically unstable, may cause bowing of the etched column, and may require supporting struts or structures.

Commonly assigned and copending U.S. patent application Ser. No. 16/859,960, entitled "3-Dimensional NOR String Arrays In Segmented Stacks," filed on Apr. 27, 2020, describes a memory structure including two or more modules each formed on top of each other and separated by a layer of global interconnect conductors. Each memory module may include a 3-dimensional array of memory transistors organized as NOR array strings. Each 3-dimensional array of memory transistors is provided vertical local word lines as gate electrodes to the memory transistors. These vertical local word lines are connected by the layers of global interconnect conductors below and above each 3-dimensional array of memory transistors to circuitry formed in the semiconductor substrate. The '960 patent application is a continuation application of U.S. patent application Ser. No. 16/006,573, entitled "3-Dimensional NOR String Arrays in Segmented Stacks," filed on Jun. 12, 2018, now U.S. Pat. No. 10,692,874, issued Jun. 23, 2020, which is related to and claims priority of U.S. provisional application, Ser. No. 62/552,661, entitled "3-Dimensional NOR String Arrays in Segmented Stacks," filed on Jun. 20, 2017. The aforementioned patent applications and patent are incorporated herein by reference in their entireties.

BRIEF SUMMARY OF THE INVENTION

According to embodiments of the present invention, a method for forming a three-dimensional memory structure above a semiconductor substrate includes forming two or more active stack sections, each formed on top of each other and separated by a dielectric buffer layer, where each active stack section includes multilayers separated by isolation dielectric layers and trenches with shafts filled with a sacrificial material. After the multiple active stack sections are formed, the method removes the sacrificial material in the shafts and removes portions of the dielectric buffer layer between shafts of adjacent active stack sections. The method fills the openings with a gate dielectric layer and a conductor. In some embodiments, the gate dielectric layer and the conductor form local word line structures of the memory structure. In this manner, the aspect ratio for the anisotropic etching to form the trenches in each active stack section is reduced for better process control. Furthermore, the process for forming the charge-storage layer is performed only once for all of the active stack sections, thereby reducing the thermal budget experienced by the memory structure during the fabrication process.

In some embodiments, a process suitable for use in fabricating a memory structure including storage transistors of a NOR memory string above a planar surface of a semiconductor substrate includes, above the planar surface, forming an active stack section including repeatedly depositing, alternately and one over another, a multilayer and an isolation dielectric layer, each multilayer including first and second semiconductor layers of a first conductivity type, and a dielectric layer between the first and the second semiconductor layers; forming a set of trenches in the active stack section to divide the multilayers into multiple stacks of multilayer strips, each stack being separated from an adjacent stack by one of the trenches; forming a third semiconductor layer of a second conductivity type, opposite the first conductivity type, on sidewall of the trenches adjacent each multilayer and in contact with the first and the second semiconductor layers; filling the set of trenches with a dielectric filler material and forming in each trench a set of shafts, the shafts being formed between the dielectric filler material; depositing into each shaft a sacrificial material; depositing a dielectric buffer layer on the active stack section; repeatedly forming the active stack section with the sacrificial material-filled shafts and the dielectric buffer layer, alternately and one over another, to form a set of active stack sections separated by the dielectric buffer layers between adjacent active stack sections, each sacrificial material-filled shaft in one active stack section being in alignment with the sacrificial material-filled shafts in adjacent active stack sections; removing the sacrificial material from the shafts of the set of active stack sections and removing portions of the dielectric buffer layer situated between the shafts of adjacent active stack sections to form buffer layer openings; and forming in the shafts and the buffer layer openings a charge-storage layer and a conductor.

In some embodiments, a memory structure includes a semiconductor substrate having a planar surface; first and second memory sections formed above the planar surface, the second memory section being provided on top of the first memory section, wherein each memory section includes a three-dimensional array of NOR-type memory strings, wherein each 3-dimensional array of NOR-type memory strings includes two or more NOR-type memory strings separated from each other along a first direction that is substantially parallel the planar surface and two or more NOR-type memory strings separated from each other along a second direction that is orthogonal to the first direction and substantially perpendicular the planar surface, and wherein each NOR-type memory string including multiple thin-film memory transistors provided along a third direction that is substantially orthogonal both the first and second directions; a dielectric buffer layer formed between the first and the second memory sections; a set of local word line conductors extending along the second direction from the first memory section to the second memory section to form gate electrodes to the thin-film memory transistors of one or more NOR-type memory strings; and a gate dielectric layer encircling each local word line conductors and extending along the second direction from the first memory section to the second memory section to form the gate dielectric layer to the thin-film memory transistors of the one or more NOR-type memory strings.

In other embodiments, a process suitable for use in fabricating a memory structure including storage transistors of a NOR memory string above a planar surface of a semiconductor substrate includes above the planar surface, forming an active stack section including repeatedly depositing, alternately and one over another, a multilayer and an isolation dielectric layer, each multilayer including first and second semiconductor layers of a first conductivity type, and a dielectric layer between the first and the second semiconductor layers; forming multiple trenches in the active stack section to divide the multilayers into multiple stacks of multilayer strips, each stack being separated from an adjacent stack by one of the trenches; forming a third semiconductor layer of a second conductivity type, opposite the first conductivity type, on sidewall of the trenches adjacent each multilayer and in contact with the first and the second semiconductor layers; filling the trenches with a sacrificial material and forming in each trench multiple shafts, the shafts being formed between regions of the sacrificial material; depositing into each shaft a dielectric filler material, each regions of sacrificial material in the trenches being formed between the dielectric filled shafts; depositing a dielectric buffer layer on the active stack section; repeatedly forming the active stack section with the sacrificial material-filled regions and the dielectric buffer layer, alternately and one over another, to form multiple active stack sections separated by the dielectric buffer layers between adjacent active stack sections, each sacrificial material-filled region in one active stack section being in alignment with the sacrificial material-filled region in adjacent active stack sections; removing the sacrificial material from the regions between the dielectric filled shafts in the active stack sections and removing portions of the dielectric buffer layer situated between the regions of adjacent active stack sections to form buffer layer openings; and forming in the regions and the buffer layer openings a charge-storage layer and a conductor.

In some embodiments, forming in each trench the shafts between regions of the sacrificial material and depositing into each shaft the dielectric filler material includes filling the trenches with the sacrificial material; and forming shafts in the sacrificial material of each trench and depositing into each shaft the dielectric filler material. In yet another embodiment, the dielectric filler material includes silicon oxide and the sacrificial material includes a silicon oxide liner and an amorphous silicon material.

In other embodiments, a process suitable for use in fabricating a memory structure including storage transistors of a NOR memory string above a planar surface of a semiconductor substrate includes, above the planar surface, forming an active stack section including repeatedly depositing, alternately and one over another, a multilayer and an isolation dielectric layer, each multilayer including first and second sacrificial layers and a dielectric layer between the first and the second sacrificial layers; forming multiple trenches in the active stack section to divide the multilayers into multiple stacks of multilayer strips, each stack being separated from an adjacent stack by one of the trenches; replacing the first and second sacrificial layers with respective first and second conductive layers; forming an oxide semiconductor layer on sidewall of the trenches adjacent each multilayer and in contact with the first and the second conductive layers; filling the trenches with a dielectric filler material and forming in each trench multiple shafts, the shafts being formed between the dielectric filler material; depositing into each shaft a sacrificial material; depositing a dielectric buffer layer on the active stack section; repeatedly forming the active stack section with the sacrificial material-filled shafts and the dielectric buffer layer, alternately and one over another, to form multiple active stack sections separated by the dielectric buffer layers between adjacent active stack sections, each sacrificial material-filled shaft in one active stack section being in alignment with the sacrificial material-filled shafts in adjacent active stack sections; removing the sacrificial material from the shafts of the active stack sections and removing portions of the dielectric buffer layer situated between the shafts of adjacent active stack sections to form buffer layer openings; and forming in the shafts and the buffer layer openings a ferroelectric dielectric layer and a conductor.

In some embodiments, the oxide semiconductor layer includes one of an indium gallium zinc oxide (IGZO) layer, an indium zinc oxide (IZO) layer, an indium tungsten oxide (IWO) layer, or an indium tin oxide (ITO) layer; and the ferroelectric dielectric layer includes a doped hafnium oxide layer.

BRIEF DESCRIPTION OF THE DRAWINGS

Various embodiments of the invention are disclosed in the following detailed description and the accompanying drawings. Although the drawings depict various examples of the invention, the invention is not limited by the depicted examples. It is to be understood that, in the drawings, like reference numerals designate like structural elements. Also, it is understood that the depictions in the FIGS. are not necessarily to scale.

FIG. 4(a), is a cross-sectional view of a memory structure fabricated by repeating the process module to form multiple active stack sections in alternate embodiments of the present disclosure.

DETAILED DESCRIPTION OF THE INVENTION

According to embodiments of the present disclosure, a method for forming a three-dimensional memory structure uses a process module of forming an active stack section having a first number of active layers and applying the process module repeatedly to form the three-dimensional memory structure having a second number of active layers. More specifically, the method forms active stack sections one on top of another where each active stack section is separated from another by a dielectric buffer layer. In one embodiment, each active stack section is formed with dielectric-filled narrow trenches with shafts formed in each trench and filled with a sacrificial material. After the multiple active stack sections are formed, the method then removes the sacrificial material in the shafts and removes portions of the dielectric buffer layer between shafts of adjacent active stack sections. The method fills the openings with a gate dielectric layer and a gate conductor. In some embodiments, the gate dielectric layer and the gate conductor form local word line structures of the memory structure. In some embodiments, the gate dielectric layer in each local word line structure may be discontinuous over the depth of the multiple active stack sections.

The method of the present disclosure realizes several advantages. First, by forming the three-dimensional memory structure in multiple active stack sections, the aspect ratio for anisotropic etching of the narrow trenches for forming the local word line structures can be reduced dramatically. Accordingly, the fabrication process can be made more robust and reliable. Second, the process for forming the gate dielectric layer is performed only once for all of the active stack sections, thereby reducing the thermal budget experienced by the three-dimensional memory structure during the fabrication process. In this manner, undesired out-diffusion of dopants which can occur during the gate dielectric layer formation step is limited to improve the resulting characteristics of the memory transistor.

In the present description, to facilitate reference to the figures, a Cartesian coordinate reference frame is used, in which the Z-direction is normal to the planar surface of the semiconductor surface and the X-direction and the Y-directions are orthogonal to the Z-direction and to each other, as indicated in the figures.

Figure 3:
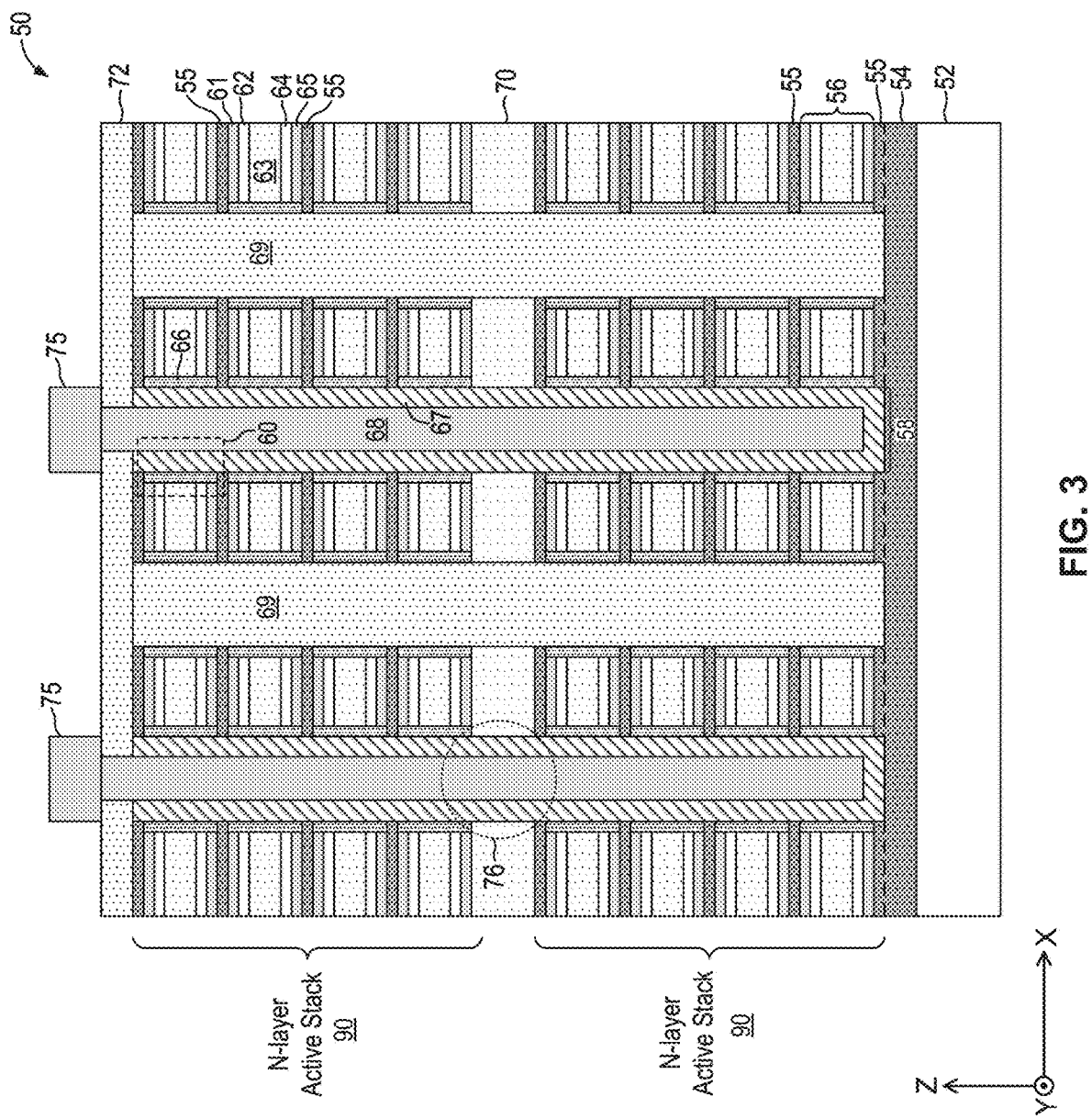
FIG. 3 is a cross-sectional view of a memory structure fabricated by repeating a process module to form multiple active stack sections in embodiments of the present disclosure.

FIG. 3 is a cross-sectional view of a memory structure fabricated by repeating a process module to form multiple active stack sections in embodiments of the present disclosure. The cross-sectional view of FIG. 3 is taken along the X-Z plane of the memory structure. Referring to FIG. 3, a memory structure 50 includes P number of active stack sections 90, P being an integer greater than 1, formed over a semiconductor substrate 52 with a dielectric layer 54 formed thereon. The multiple active stack sections 90 are formed one over another and separated by a buffer oxide layer 70, such as a silicon oxide layer. In the present embodiment, the memory structure 50 includes two active stack sections 90 (P=2). In other embodiments, P can be 4, 8, or 16. Multiple active stack sections 90 can be used to realize a memory structure with large memory capacity.

Each active stack section 90 includes N number of active layers 56, N being an integer of 1 or more. In the present embodiment, each active stack section 90 includes four active layers 56. In other embodiments, the active stack section 90 can include other numbers of active layers, that is N can be 4, 8 or 16. As a result of forming P number of active stack sections 90 with each active stack section 90 having N number of active layers 56, the memory structure 50 has K number of active layers where K=P*N. However, the memory structure 50 divides the K number of active layers into P number of sections so that the aspect ratio for etching the deep local word line trench is reduced significantly, as will be described in more detail below.

Each active layer 56 is a multilayer that includes a predetermined combination of various semiconductor, conductive and dielectric materials. In the present embodiment, each active layer 56 includes first and second doped semiconductor layers 62, 64 (e.g., $n^+$ polysilicon) separated by a dielectric layer 63 (e.g., silicon oxide). The active layer may also include one or more conductive layers 61, 65 (e.g., titanium nitride (TiN)-lined tungsten (W)), or sacrificial layers (e.g., silicon nitride) to be subsequently replaced by final conductive layers. The conductive layers 61, 65 each contact one of the semiconductor layers 62, 64 to provide a signal path of reduced resistivity in the adjacent semiconductor layer it contacts. Each active layer 56 is separated from the other by an isolation dielectric layer 55 (e.g., silicon oxycarbide (SiOC)).

The active layers 56 are divided in the X-direction by narrow trenches into narrow strips ("active strips") that are stacked one on top of another to form stacks of active strips ("active stacks") extending in the Y-direction. The narrow trenches between each pair of active stacks will be used to form local word line (LWL) structures. Subsequent processing steps form the channel regions 66 (e.g., $p^-$ polysilicon or lightly doped p-type polysilicon) on the sidewall of the active layer 56 exposed by the narrow trenches. In each active layer 56, the channel region 66 is in contact with the first and second semiconductor layers 62, 64. The trenches between adjacent active stacks, referred to as LWL regions, are then filled with a dielectric filler material 69, such as a silicon oxide layer.

In some embodiments, local word line (LWL) structures 58, each including a gate dielectric layer 67 encircling a gate electrode 68, are formed interspersed in the LWL regions formed by the dielectric-filled trenches. In the present embodiment, the gate dielectric layer 67 is a charge-storage layer. Each LWL structure 58 is separated from another LWL structure in the same LWL region by the dielectric filler material 69. In the present embodiment, the LWL structures 58 are formed staggered in adjacent LWL regions between an active stack so that storage transistors formed on both sides of an active strip are offset from each other in the Y-direction. In some embodiments, each charge-storage layer 67 is formed as an oxide-nitride-oxide (ONO) multilayer structure and each gate electrode is formed as titanium nitride (TiN)-lined tungsten (W). More specifically, the LWL structures 58 are formed as a unitary structure across all of the active stack sections 90. The charge-storage layer 67 and the gate electrode 68 extend through the buffer oxide layer 70 between two adjacent active stack sections 90, as denoted by the dotted circle 76. As thus configured, a storage transistor 60 is formed at the intersection of an active strip with the channel region and an LWL structure 58. The first and second doped semiconductor layers of each active strip form a source region ("common source line") and a drain region ("common bit line") of the storage transistors which may be formed along one or both sides of the active strip.

In the present embodiment, the memory structure 50 is capped by an encapsulation dielectric layer 72. The gate electrode of each LWL structure 58 is the local word line which is connected to a conductive layer 75 through conductive vias formed in the encapsulation dielectric layer 72. The conductors 75 form the global word line of the memory structure 50.

Figures 1, 1A:
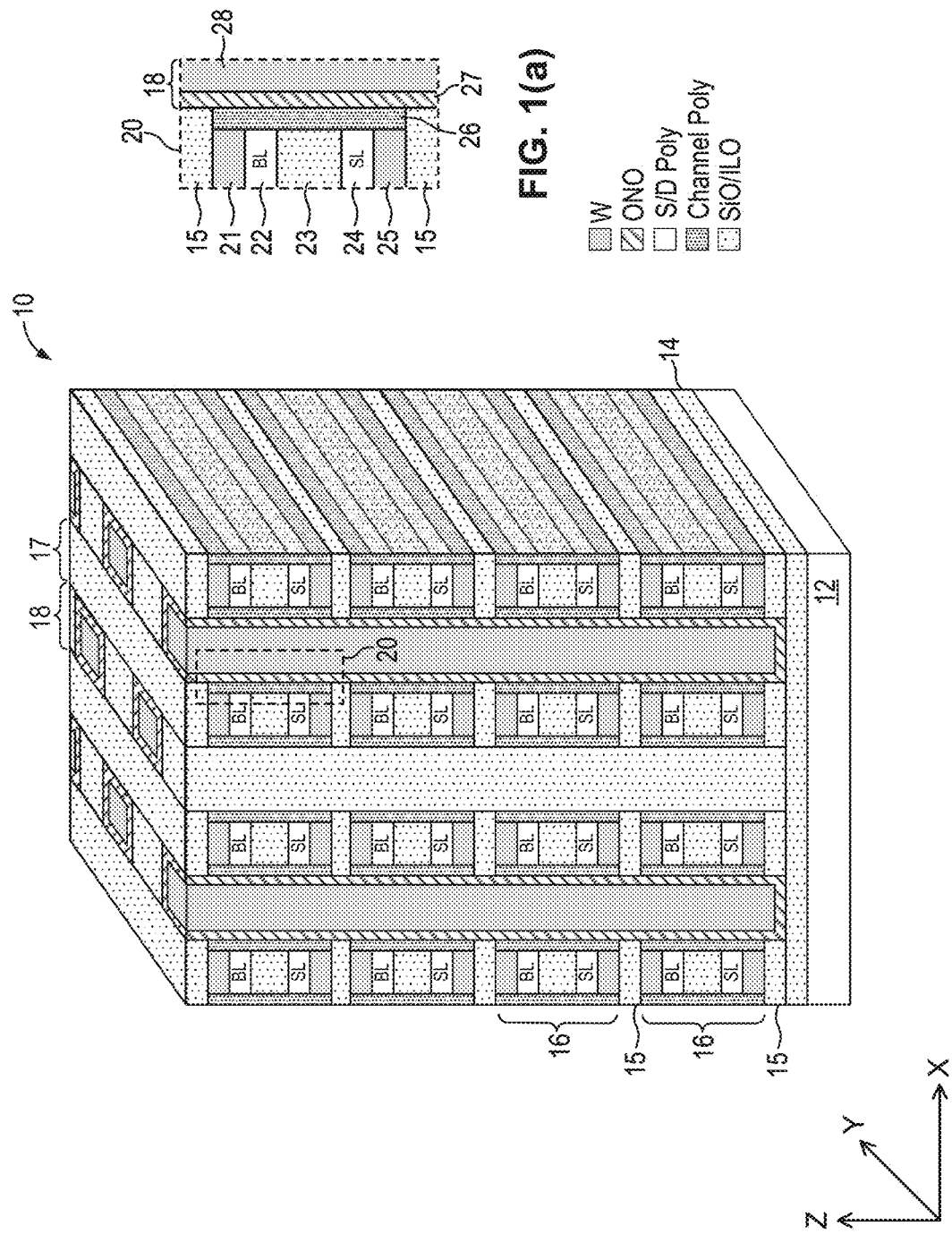
FIG. 1, which includes
FIG. 1(a), is a perspective view of a memory structure including a 3-dimensional array of NOR memory strings in some examples.
Figure 2:
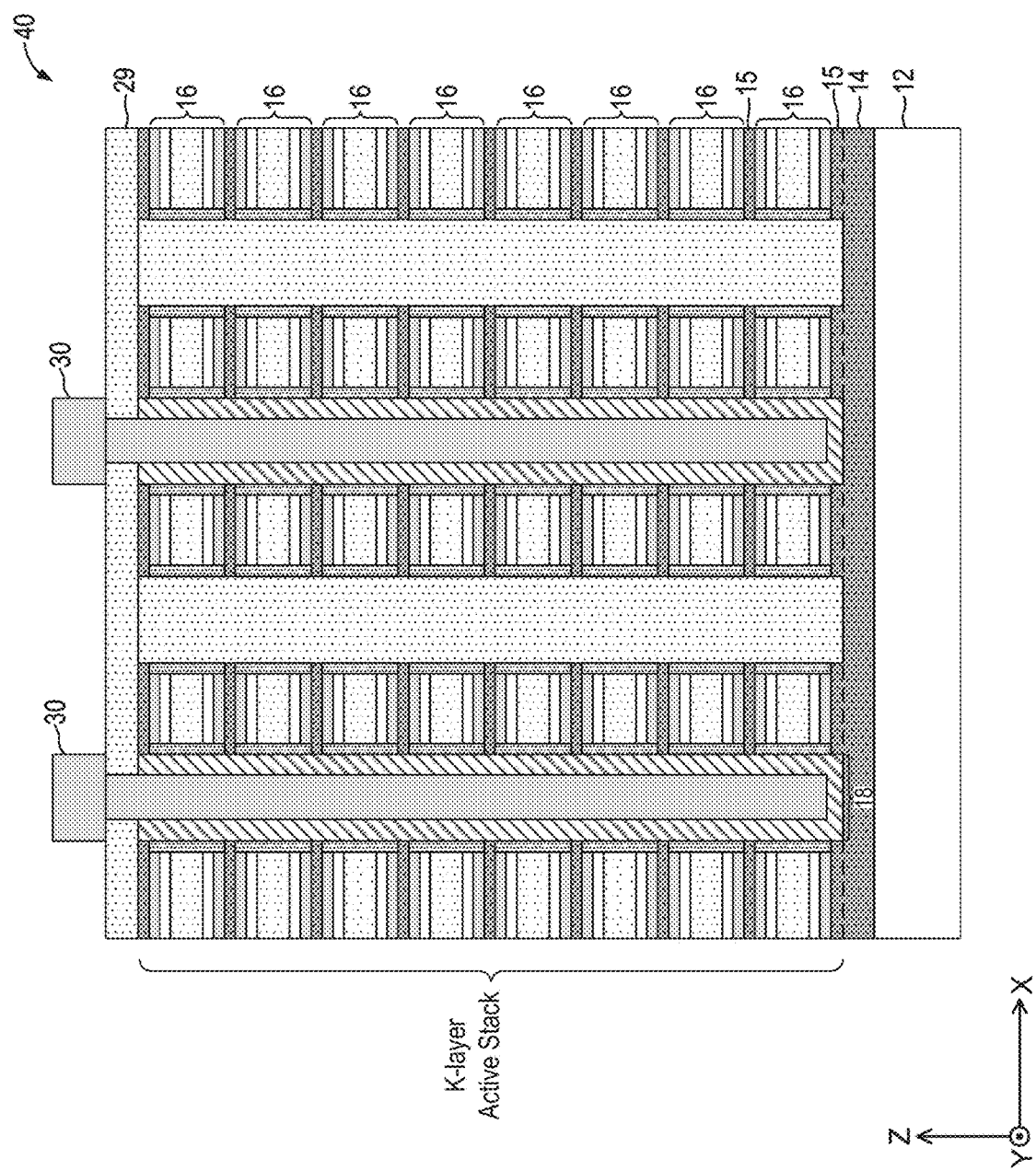
FIG. 2 is a cross-sectional view of a memory structure including a tall vertical stack in some examples.

In embodiments of the present disclosure, the memory structure is formed by sections of active layers so that the memory structure can be constructed with a large number (K) of active layers but with reduced aspect ratio for the narrow trench dry etch process. For example, in the memory structure of FIG. 2, the memory structure 40 with 8 active layers may have a height of 2 µm. Therefore, to form the narrow trenches in the memory structure 40, a high aspect ratio anisotropic dry etch has to be performed to etch the 2 µm memory structure. On the other hand, in the memory structure 50, a process module that forms a limited number of active layers is repeated to obtain the total number of active layers. With each process module forming an active stack section 90 with only a limited number of active layers, the aspect ratio for the anisotropic dry etch to form trenches in the active layers is reduced significantly. For example, with 4 active layers in each active stack section, the height of the active stack section may be only 1 µm. The lower aspect ratio ensures a fabrication process with better process margin for the narrow trench dry etch processing step.

A feature of the fabrication process for forming the memory structure is that the charge-storage layer 67 is performed only once for the P number of active stack sections. That is, the LWL structures are formed using a sacrificial material as each active stack section is formed. When the memory structure 50 is completed with the P number of active stack sections, the fabrication process replaces the sacrificial material with the charge-storage layer. In this manner, the charge-storage layer formation process is performed only once for the memory structure 50 so that the memory structure does not experiencing a high thermal budget. In practice, the formation of the charge-storage layer requires a high temperature anneal process. It is desirable to not subject the channel region to excessive high-temperature processing steps which may cause undesirable out-diffusion of the source-drain dopants into the channel region. According to embodiments of the present disclosure, the fabrication process for forming the memory structure 50 forms multiple active stack sections with each active stack sections having lower aspect ratio for anisotropic dry etch while performing the high-temperature process of the charge-storage layer only once for the multiple active stack sections. In this manner, the fabrication process optimizes the fabrication process margin as well as the transistor characteristics of the memory structure.

Figure 4:
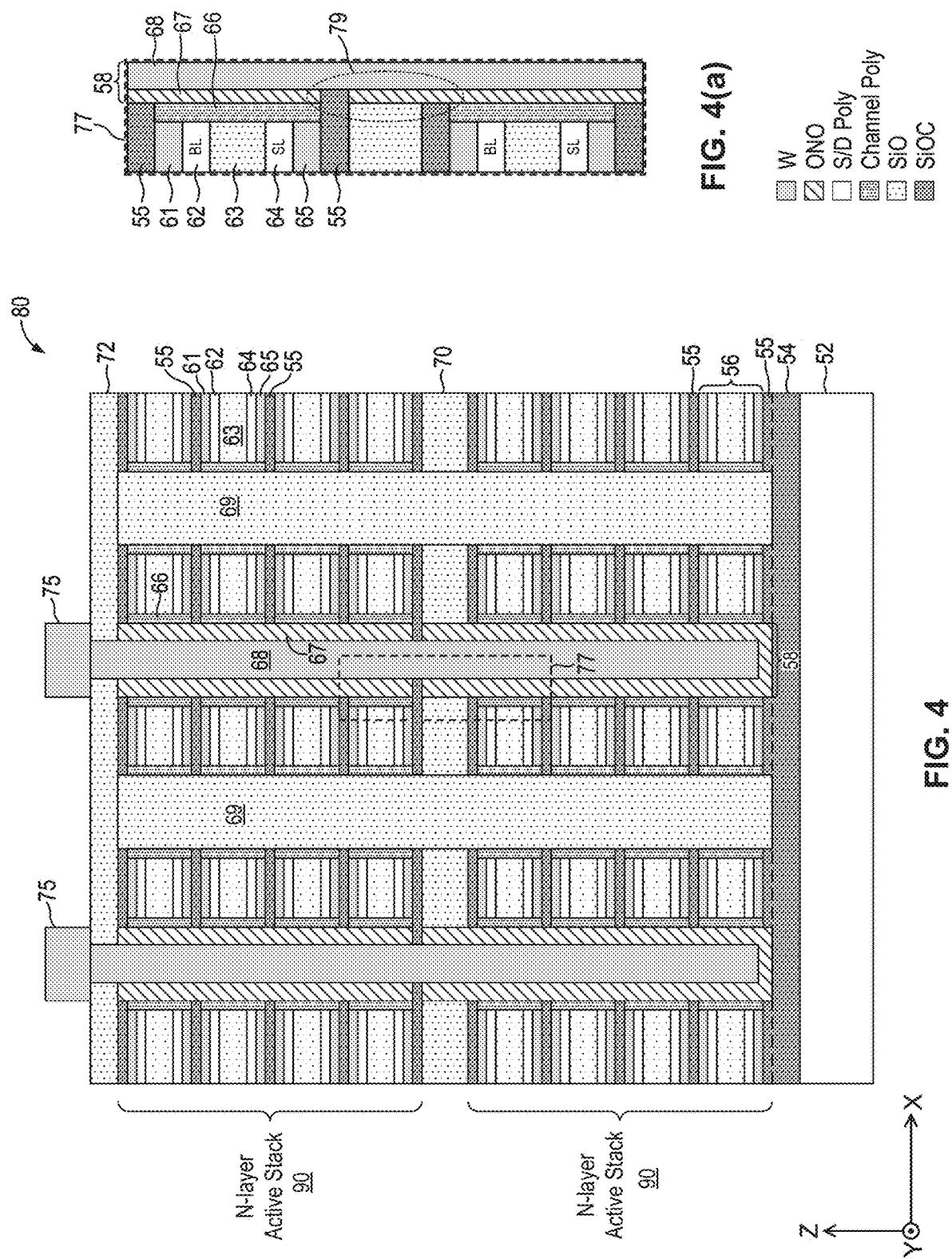
FIG. 4, which includes

In embodiments of the present disclosure, the charge-storage layer 67 formed in LWL regions may be formed as a continuous layer across the multiple active stack sections, as denoted by dotted circle 76 in FIG. 3. In other embodiments, the charge-storage layer 67 may be discontinuous at or around the buffer oxide layer 70. FIG. 4, which includes FIG. 4(a), is a cross-sectional view of a memory structure fabricated by repeating the process module to form multiple active stack sections in alternate embodiments of the present disclosure. Referring to FIG. 4, a memory structure 80 is constructed in a similar manner as the memory structure 50 of FIG. 3. Same elements in FIGS. 3 and 4 are given the same reference numerals to simplify the discussion. The memory structure 80 is formed with a charge-storage layer 67 that is discontinuous at the buffer oxide layer 70. In particular, in some embodiments, the bottommost active layer of the upper active stack section may include an isolation dielectric layer 55 as the first layer above the buffer oxide layer 70, as shown by dotted box 77. For example, the dielectric layer 55 may be an SiOC layer. The isolation dielectric layer 55 on the buffer oxide layer 70 may not be removed during the replacement process for the charge-storage layer and the conductor, as shown by the dotted circle 79 in FIG. 4(a). In that case, subsequently formation of the charge-storage layer 67 may include discontinuous portions at the buffer oxide area (dotted circle 79). It is instructive to note that the operation of the memory structure does not require the charge-storage layer 67 to be continuous across the multiple active stack sections, as long as the conductor 68 is continuous across all multiple active stack sections.

Figure 5:
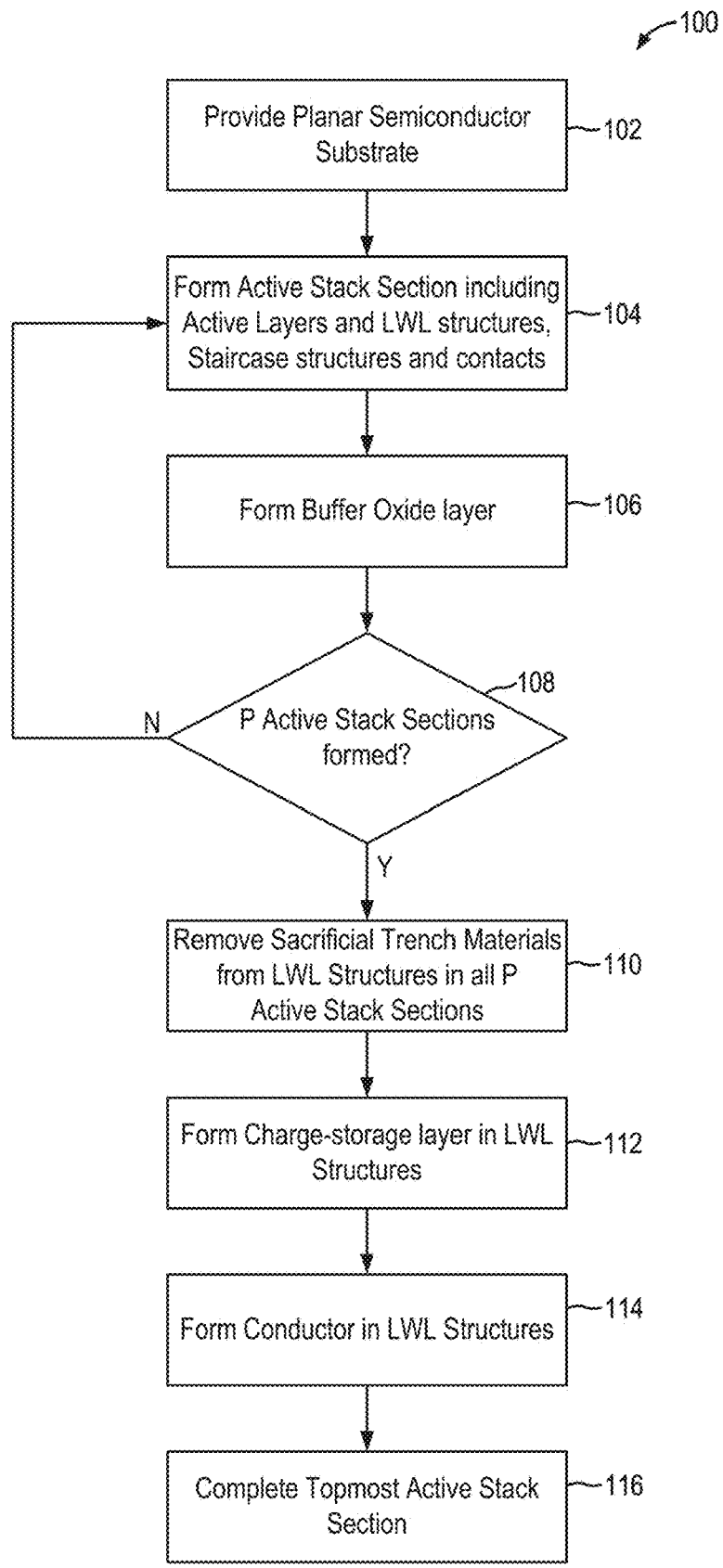
FIG. 5 is a flowchart illustrating a fabrication process for forming a memory structure using repeated active stack sections in embodiments of the present disclosure.
Figure 6A:
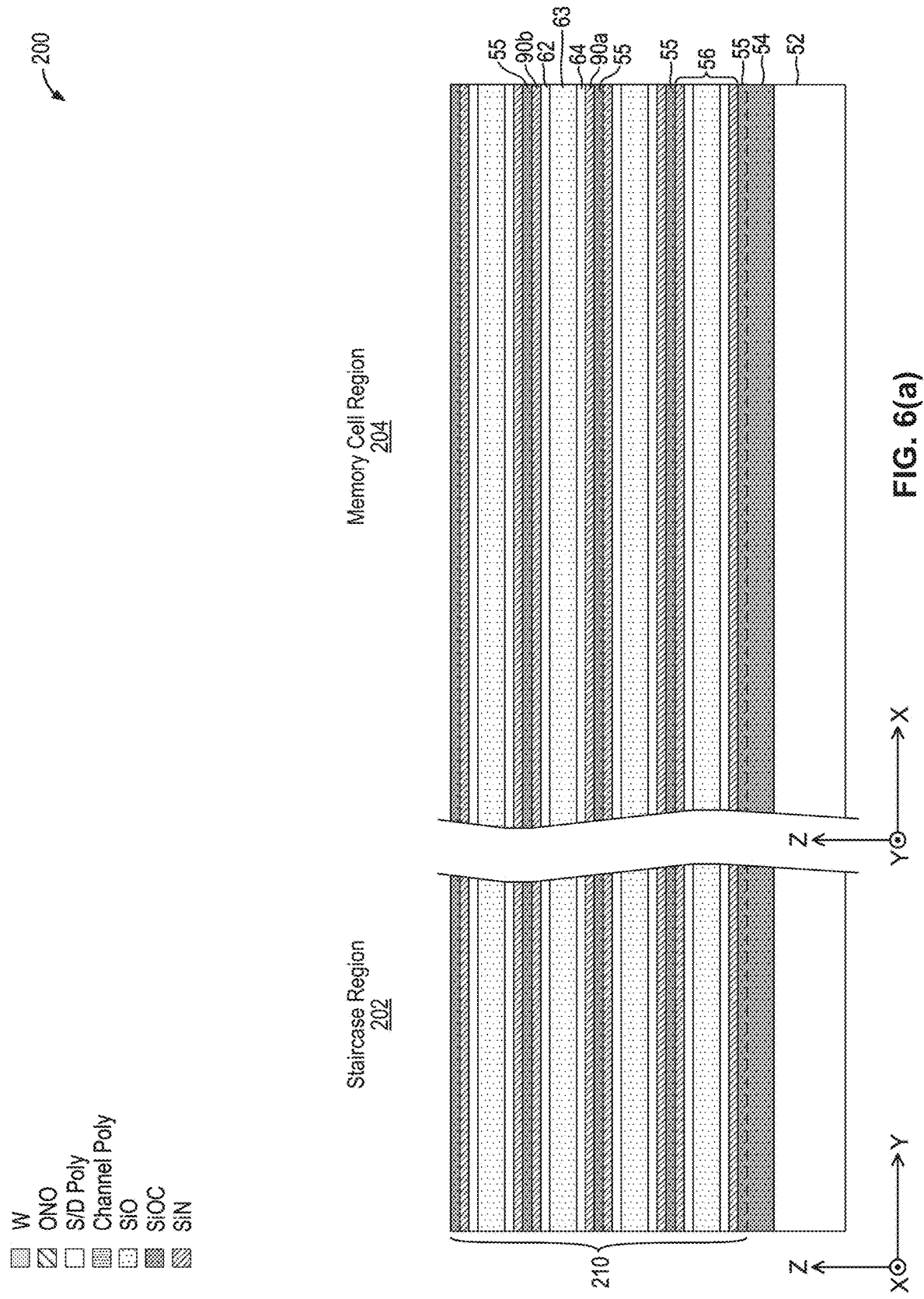
FIGS. 6(a) to 6(p) illustrate the process steps in a process for fabricating a memory structure using repeated active stack sections according to embodiments of the present disclosure.
Figure 6B:
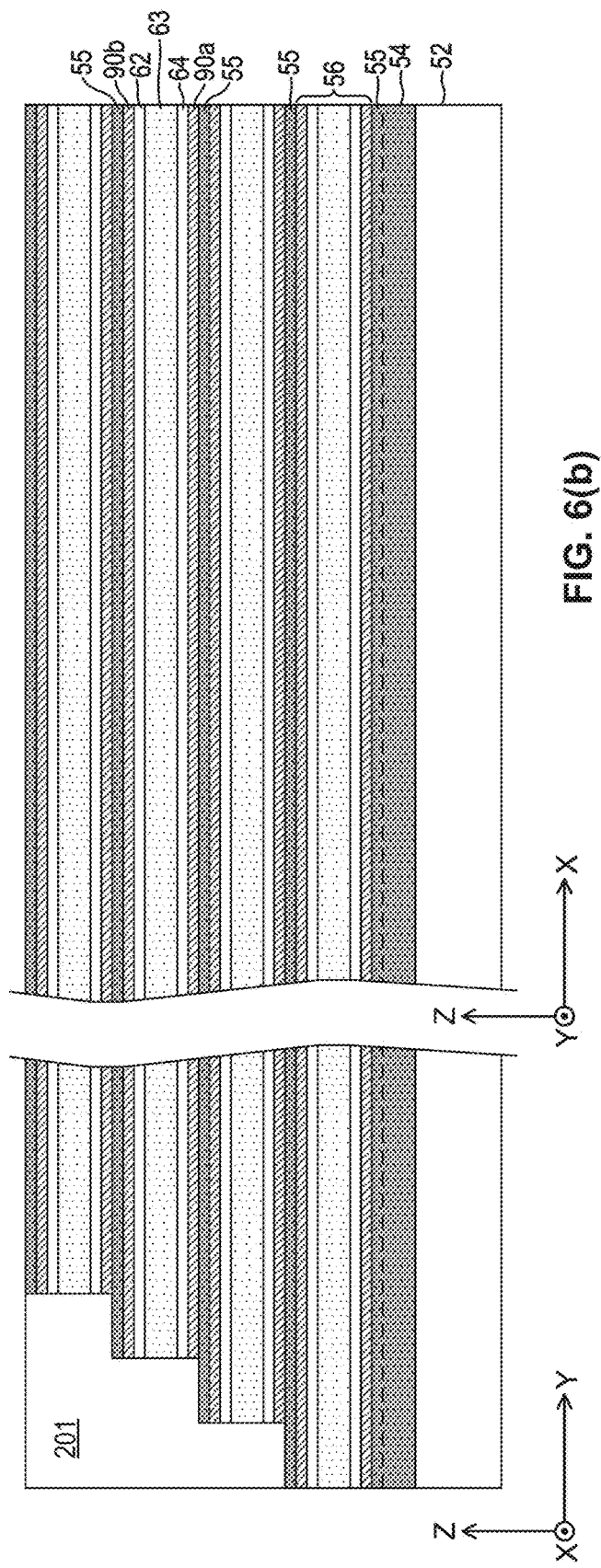

The fabrication process for forming the memory structure of FIGS. 3 and 4 will now be described with reference to FIG. 5 and FIGS. 6(a) to 6(p). FIG. 5 is a flowchart illustrating a fabrication process for forming a memory structure using repeated active stack sections in embodiments of the present disclosure. FIGS. 6(a) to 6(p) illustrate the process steps in a process for fabricating a memory structure using repeated active stack sections according to embodiments of the present disclosure. Referring to FIGS. 5 and 6(a), initially, at 102, a method 100 for forming a memory structure 200 provides a planar semiconductor substrate 52. A dielectric layer 54 may be provided on the planar semiconductor substrate 52. In some embodiments, the dielectric layer 54 is a silicon oxycarbide (SiOC) layer. Each figure in FIGS. 6(a) to 6(p) illustrates two views of the memory structure 200: (i) a view of the staircase region 202 along the Y-Z plane; and (ii) a view of the memory cell region 204 along the X-Z plane.

At 104, the method 100 performs a process module for forming N number of multilayer with local word line (LWL) structures, staircase structures and staircase contacts. In particular, the memory structure 200 is formed by successive depositions of (i) a multilayer 56 and (ii) an isolation dielectric layer 55 on the planar surface of a semiconductor substrate 52, until an active stack section of N number of multilayer 56 is formed. The multilayer 56 includes (a) first silicon nitride layer 90*a*, (b) first phosphorus-doped amorphous silicon layer 64, (c) a dielectric layer 63, (d) second phosphorus-doped amorphous silicon layer 62, and (e) second silicon nitride layer 90*b*. The isolation dielectric layer 55 may be, for example, a 30-nm thick SiOC layer. First and second silicon nitride layers 90*a* and 90*b* each may be 40 nm thick, and first and second phosphorus-doped amorphous silicon layers 62 and 64 each may be 30 nm thick and the dielectric layer 63 may be, for example, 100 nm thick. In the present description, the dimensions are provided merely for illustrative purposes and are not intended to be limiting. In actual implementation, any suitable thicknesses or dimensions may be used. FIG. 6(*a*) shows the memory structure 200 after the depositions of thin films to form N multilayers, separated by the isolation dielectric layer. Multilayer 56 is also referred in this detailed description as an "active layer."

With the multilayer structure thus formed, the process module forms the staircase structure in the staircase region 202, as shown in FIG. 6(*b*). To provide access to contact the common bit line at each multilayer 56, a staircase terrace is formed in the staircase region. In one example, successive recessing and etching steps are used to create a staircase terrace exposing a portion of each active layer 56.

For example, in some embodiments, the surface of the staircase region 202 of the memory structure 200 is patterned by a mask layer to expose a first portion of the memory structure. The exposed portion of the topmost isolation dielectric layer 55 is then removed to expose a portion of the multilayer (active layer) 56 underneath. The exposed portion of the multilayer 56 is then removed, exposing a portion of the isolation dielectric layer 55 underneath. The mask layer is then recessed to expose a new portion of the isolation dielectric layer 55. Removal of the exposed isolation dielectric layer 55, removal of the multilayer 56 and recessing the mask layer are then repeated N−1 more times to form the staircase structure as shown in FIG. 6(*b*). Thereafter, an oxide layer 201 is deposited to fill the portions of active layers removed. For example, the oxide layer 201 may be a silicon oxide layer. A chemical-mechanical polishing (CMP) step is carried out to remove the mask layer and to planarize the top surface of memory structure 200.

Subsequent to the staircase terrace formation, the process module forms local word line structures in the N multilayers in the memory cell region 204. Referring to FIG. 6(*c*), a first set of trenches 82 are formed in the N multilayers using, for example, an anisotropic etch after a photo-lithographical patterning step. In some embodiments, the first set of trenches 82 may be 70 nm wide, with a spacing of 190 nm apart. With the first set of trenches exposing sidewalls of the active layers 56, a channel regions 66 is formed on the sidewall of the active layer 56 exposed by the narrow trenches 82. In each active layer 56, the channel region 66 is in contact with the first and second semiconductor layers 62, 64. In some embodiments, the channel region is formed by p⁻ polysilicon or lightly doped p-type polysilicon. The trenches are then filled by a dielectric material 69. In some embodiments, the dielectric material 69 is a silicon oxide material, such as $SiO_2$. Excess dielectric material may be removed from the top of memory structure 200 using, for example, chemical-mechanical polishing (CMP).

With the mechanical support from the dielectric material 69, a second set of trenches 84 are then formed in the N multilayers using substantially the same technique as discussed above. In some examples, the second set of trenches 84 may be 70 nm wide. Each trench in the second set of trenches 84 is cut between an adjacent pair of the first set of trenches 82 and each of the second set of trenches 84 is cut substantially equidistant between an adjacent pair of the first set of trenches 82. As a result of trenches 82 and 84 being cut in the multilayer structure, stacks in the multilayer 56 are formed which are referred to as "active stacks" in the present description. In some examples, the active stacks are each approximately 60 nm wide. The resulting narrow strips resulting from the cutting of the active layers 56 are referred herein as "active strips." In the present description, a portion of the memory structure including N multilayers of active stacks is referred to as an active stack section.

With the second set of trenches 84 thus formed, the first and second silicon nitride layers 90*a* and 90*b* in the memory cell portion 204 are then removed using, for example, a wet etch, thereby creating cavities between the isolation dielectric layer 55 and respective amorphous silicon layers 62, 64. The cavities are filled by conductive layers 61 and 65. In some example, conductive layers 61 and 65 are each formed by successively depositing a titanium nitride (TiN) liner and a tungsten (W) layer. The TiN liner may be formed using, for example, an atomic layer deposition (ALD) technique. An etching step removes any of the deposited material from the sidewalls of the trenches 84. In some examples, an isotropic wet etch is used to remove the deposited material from the sidewalls of trenches 84. A channel regions 66 (e.g., p⁻ polysilicon or lightly doped p-type polysilicon) is formed on the sidewall of the active layer 56 exposed by the second set of narrow trenches 84. In each active layer 56, the channel region 66 is in contact with the first and second semiconductor layers 62, 64. Trenches 84 are then filled by the dielectric material 69, such as $SiO_2$. Excess deposited materials may be removed from the top of memory structure 200 by CMP.

First and second phosphorus-doped amorphous silicon layers 64 and 62 provide the common source line and the common bit line of an HNOR memory string to be formed. Conductive layers 65 and 61 reduce the resistivity of the adjacent common source line or common bit line they contact. The trenches 82, 84 between adjacent active stacks are referred to as LWL regions where the local word line (LWL) structures are to be formed.

Subsequent to trenches 82 and 84 being formed and being filled with the dielectric material 69, shafts are patterned and cut in dielectric material 69 using, for example, an anisotropic etch. In some embodiments, the shafts are formed staggered in adjacent trenches bordering an active strip so that the storage transistors to be formed on both sides of an active strip are offset from each other in the Y-direction along the memory string. In FIG. 6(*c*), the cross-sectional view shows the shafts that are formed in the first set of trenches 82 and the shafts formed in the second set of trenches 84 are staggered and therefore the dielectric material 69 is shown in this cross-sectional plane.

In embodiments of the present disclosure, the LWL structures to be formed in the LWL regions can be fabricated using various techniques. In one embodiment, in a direct LWL process, the LWL structures are to be formed in the shafts. In another embodiment, in an inverse LWL process, the LWL structures are to be formed in the regions between adjacent shafts in the LWL regions and the shafts will be filled by a dielectric material to isolate adjacent LWL structures. The aforementioned patent application I and patent application II describe the direct LWL process and the inverse LWL process in greater details. In the following description, the direct LWL process is used. It is understood that the method of the present invention can be implemented using the inverse LWL process. The exact process for forming the LWL structures is not critical to the practice of the present disclosure.

Figure 6C:
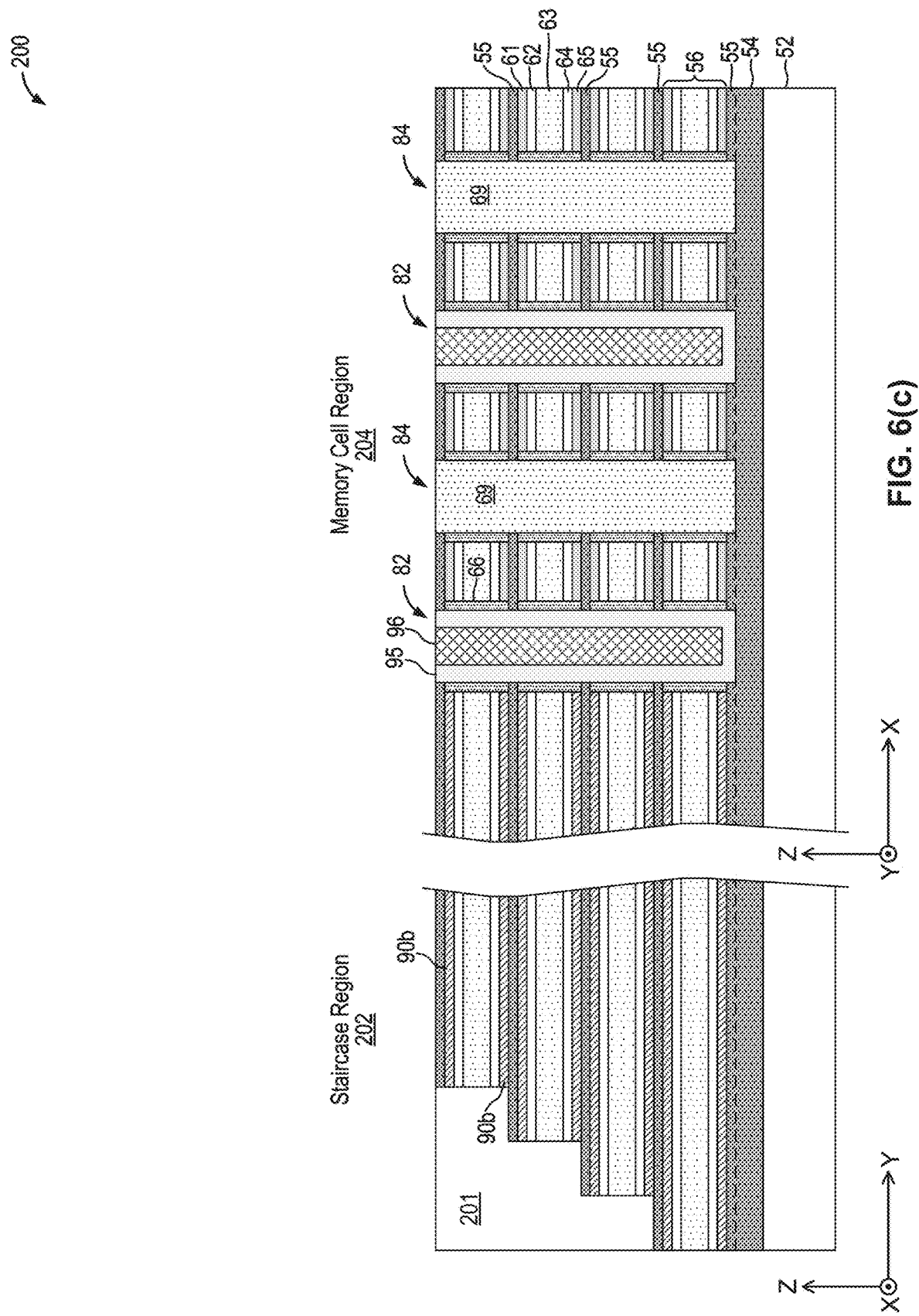

Referring still to FIG. 6(c), after shafts are formed in the LWL regions (trenches 82, 84), the shafts are filled with a sacrificial trench material. In the present embodiment, the sacrificial trench material includes a sacrificial silicon oxide liner 95 and a sacrificial amorphous silicon filler 96. Excess materials on top of memory structure 200 may be removed using, for example, CMP. As will be explained in more details below, the LWL structures in the active stack section are first formed with a sacrificial trench material and at a later processing step, the method will replace the sacrificial trench material with the charge-storage layer and the conductor after all the active stack sections are formed. In this manner, the charge-storage layer formation process is performed only once for all of the active stack sections, thereby reducing the thermal budget of the fabrication process of the memory structure.

Figure 6D:
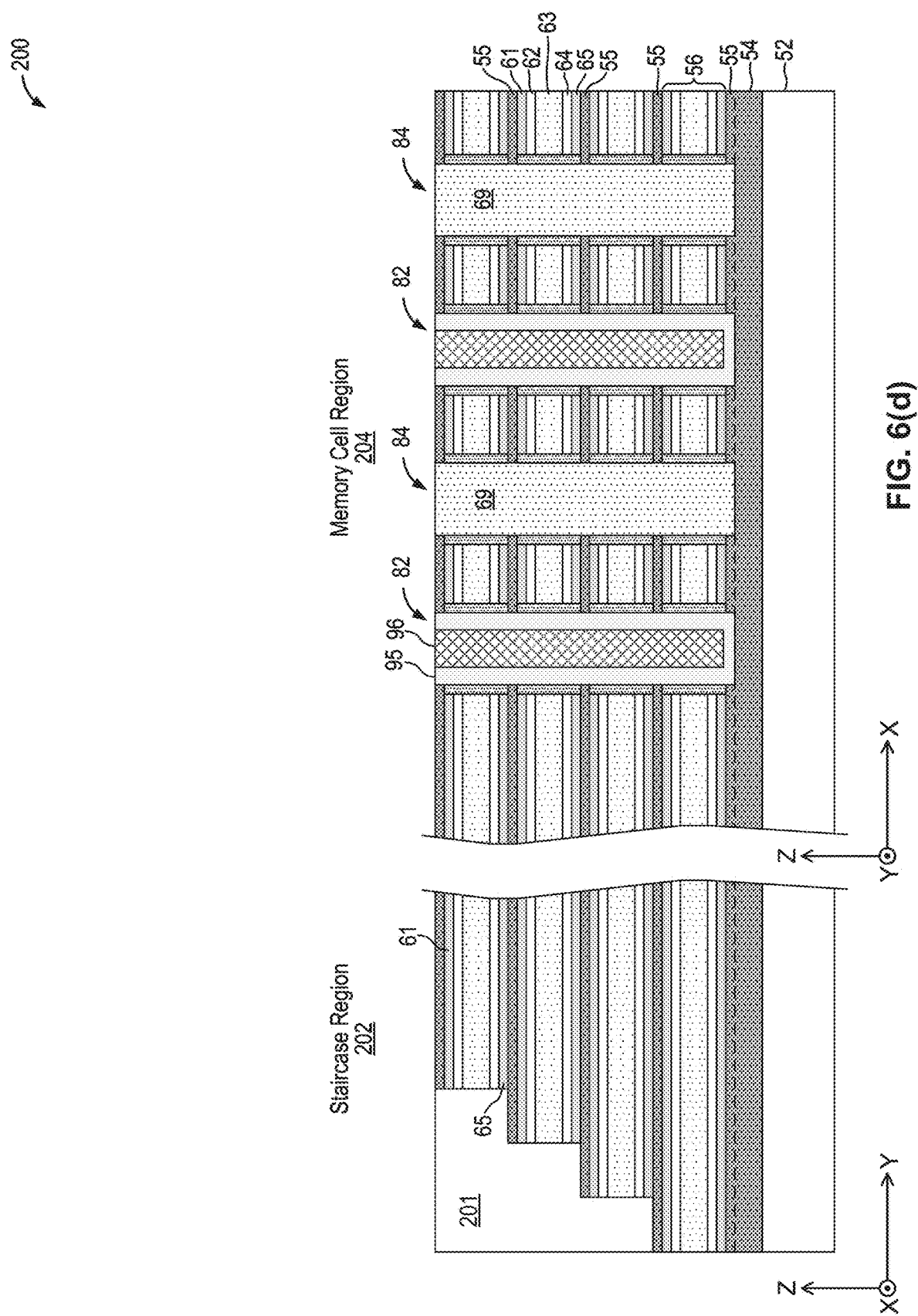

At this stage, the method may perform other processing steps, such as to form precharge transistors in the NOR memory string. Referring to FIG. 6(d), the method may also form trenches in the staircase region 202 and replaces the first and second silicon nitride layers 90a and 90b in the staircase region 202 with conductive layers, such as a titanium nitride (TiN) lined tungsten (W) layer, using the process described above with reference to the memory cell region 204.

Figure 6E:
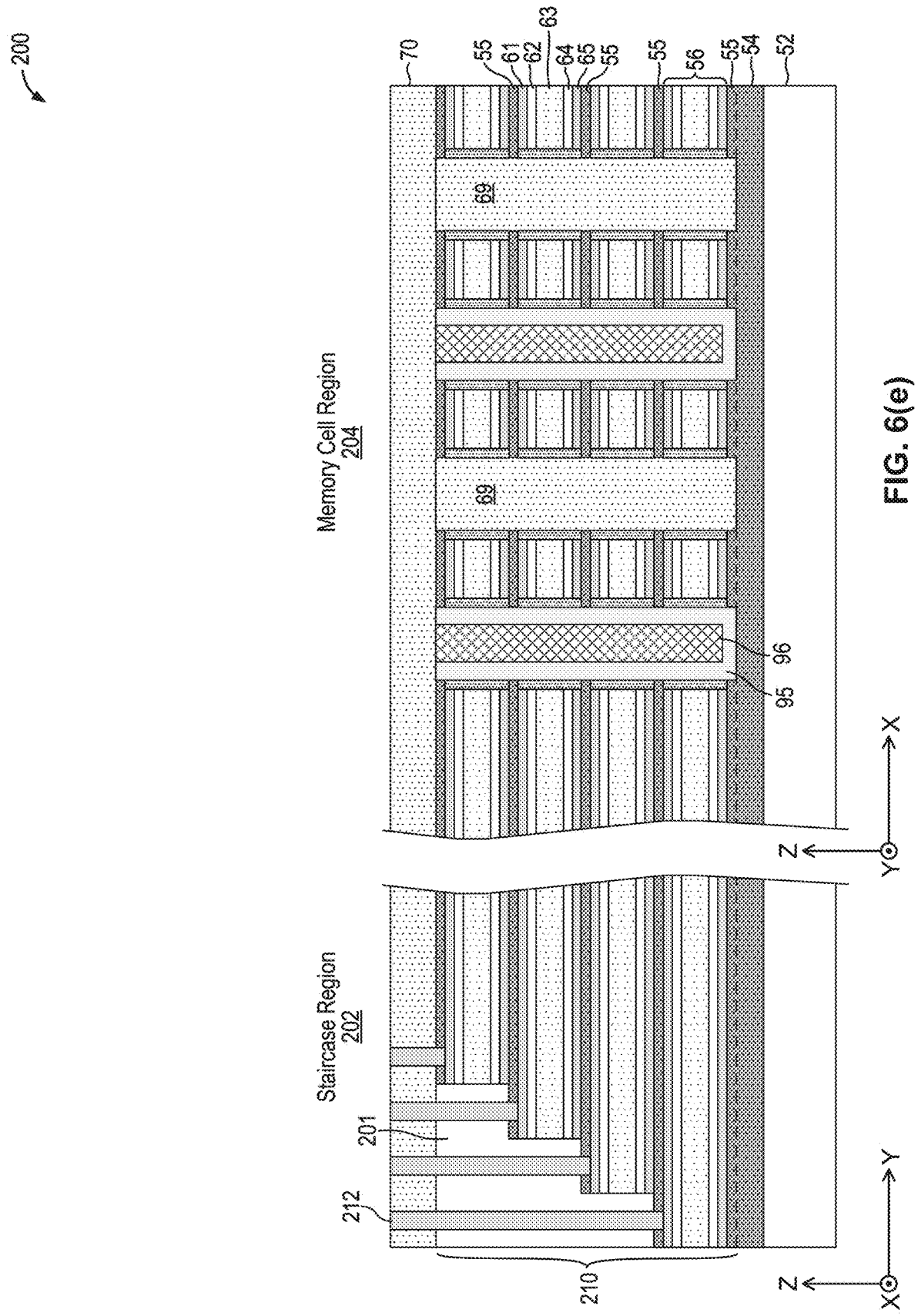

Referring to FIG. 6(e), the active stack section 210 is now complete with the LWL structures filled with the sacrificial trench material. With the active stack section 210 thus formed, a dielectric buffer layer 70 is deposited on the active stack section (step 106, FIG. 5). The dielectric buffer layer 70, also referred to as a buffer oxide layer, may be a silicon oxide layer. Subsequently, openings are made in the buffer oxide layer 70 and in the oxide layer 201 to form staircase contacts 212. In particular, each staircase contact 212 connects to the conductive layer 61 (the common drain line) of each active layer at the staircase region 202.

At this stage, the process module for forming the active stack section 210 including N number of multilayer with local word line structures, staircase structures and staircase contacts and forming the buffer oxide layer 70 to isolate active stack section is completed. The method 100 repeats the process module until P number of active stack sections are formed (step 108, FIG. 5). In particular, the method 100 repeats the process module (steps 104 and 106) to form P number of active stack sections.

Figure 6F:
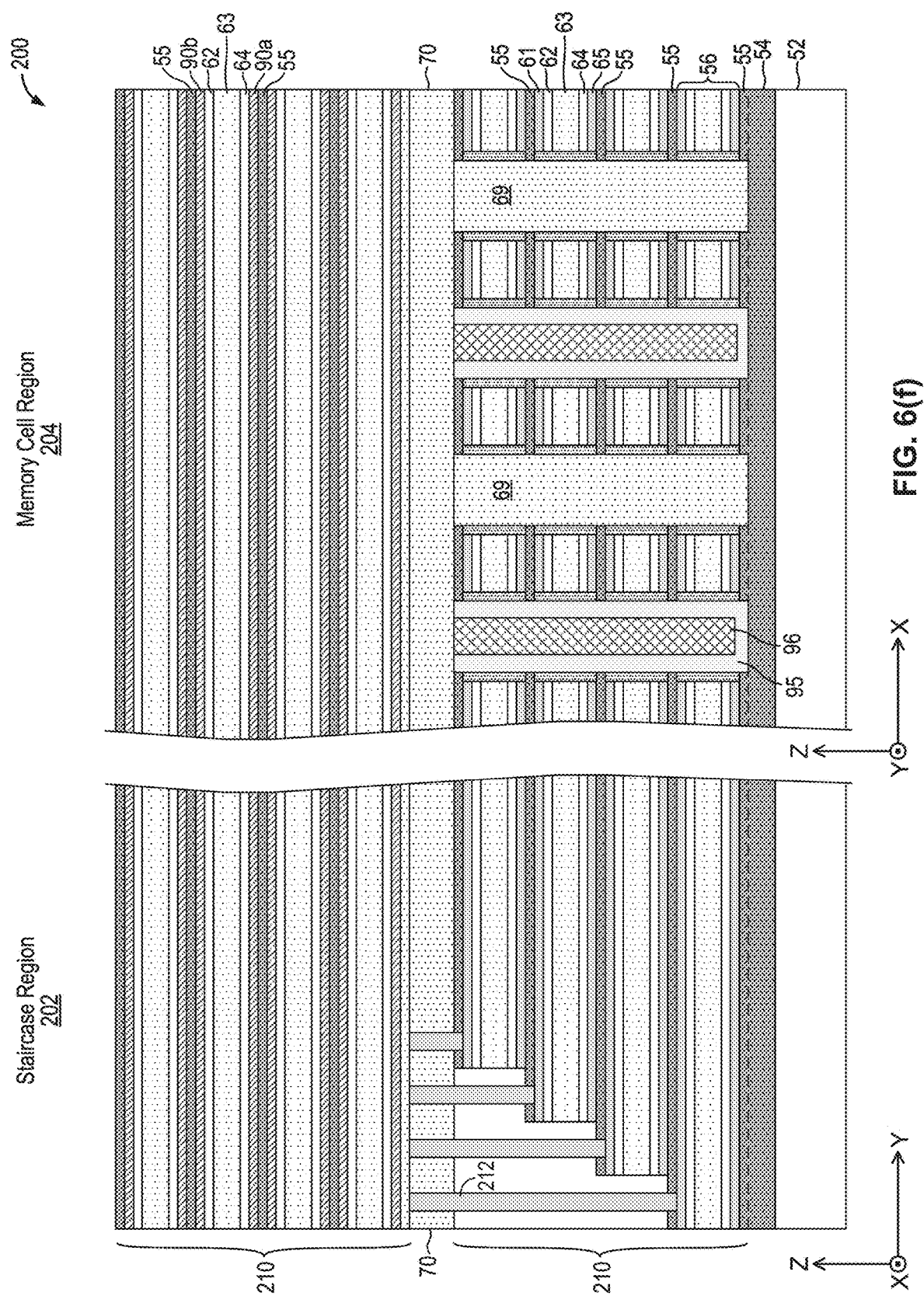

Referring now to FIG. 6(f), the method 100 forms N active layers 56 on the buffer oxide layer 70, each active layer being separated by the isolation dielectric layer 55. The N active layers will be processed in the same manner as described above to form another active stack section 210. It is instructive to note that the first active layer 56 that is formed on the buffer oxide layer 70 omits the first isolation dielectric layer 55 (i.e., the isolation dielectric layer 55 formed below the sacrificial silicon nitride layer 90a in the active layer). Alternately, the first isolation dielectric layer 55 can be formed using the same dielectric material as the buffer oxide layer 70, as opposed to a dielectric material that has different etch properties than the buffer oxide layer 70. As described above, the isolation dielectric layer 55 is typically a silicon oxycarbide layer having different etch properties than a silicon oxide layer. By omitting or replacing the first isolation dielectric layer 55 with a silicon oxide layer, the process steps for forming the LWL structures across all the active sections are simplified.

Figure 6G:
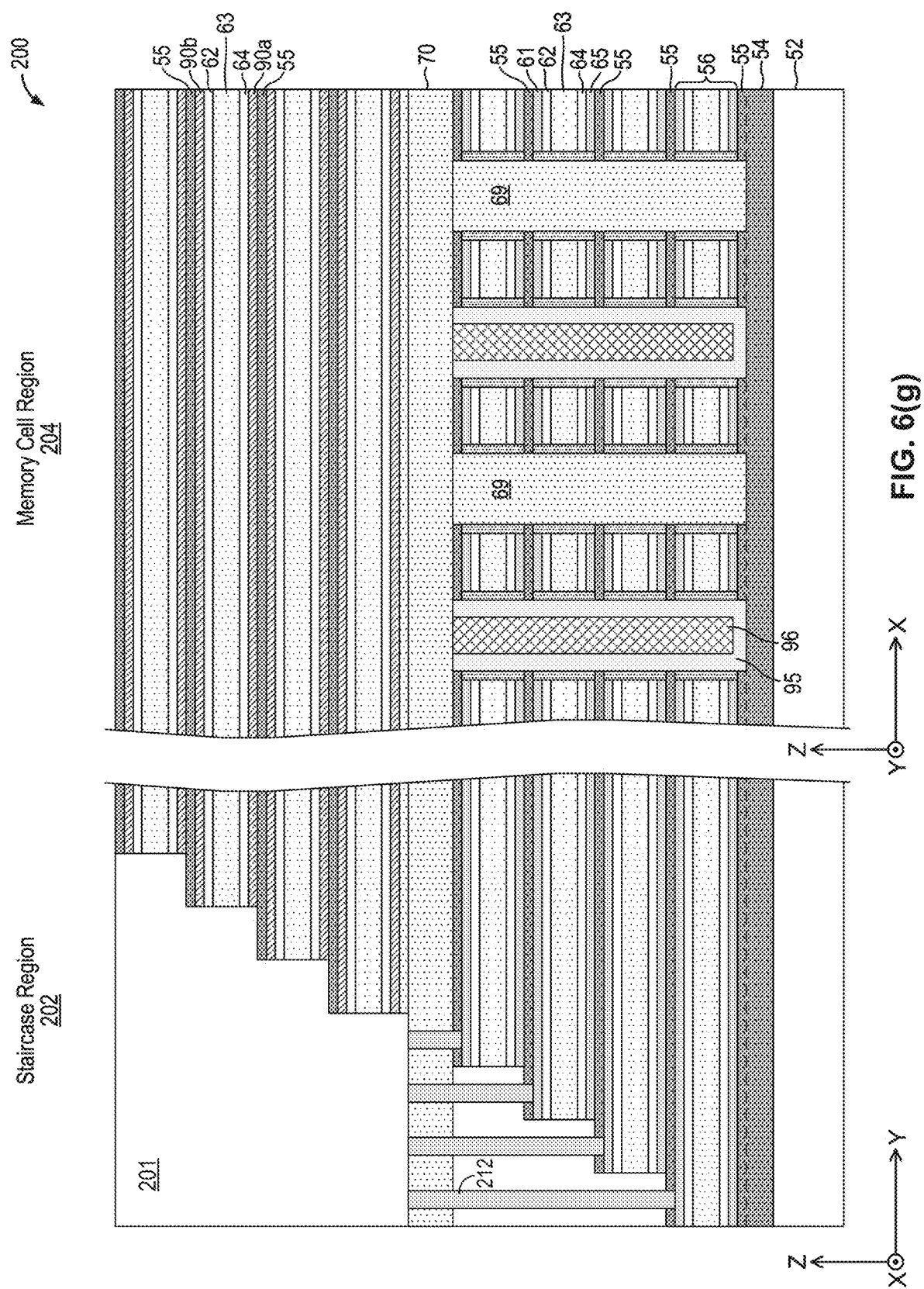
Figure 6H:
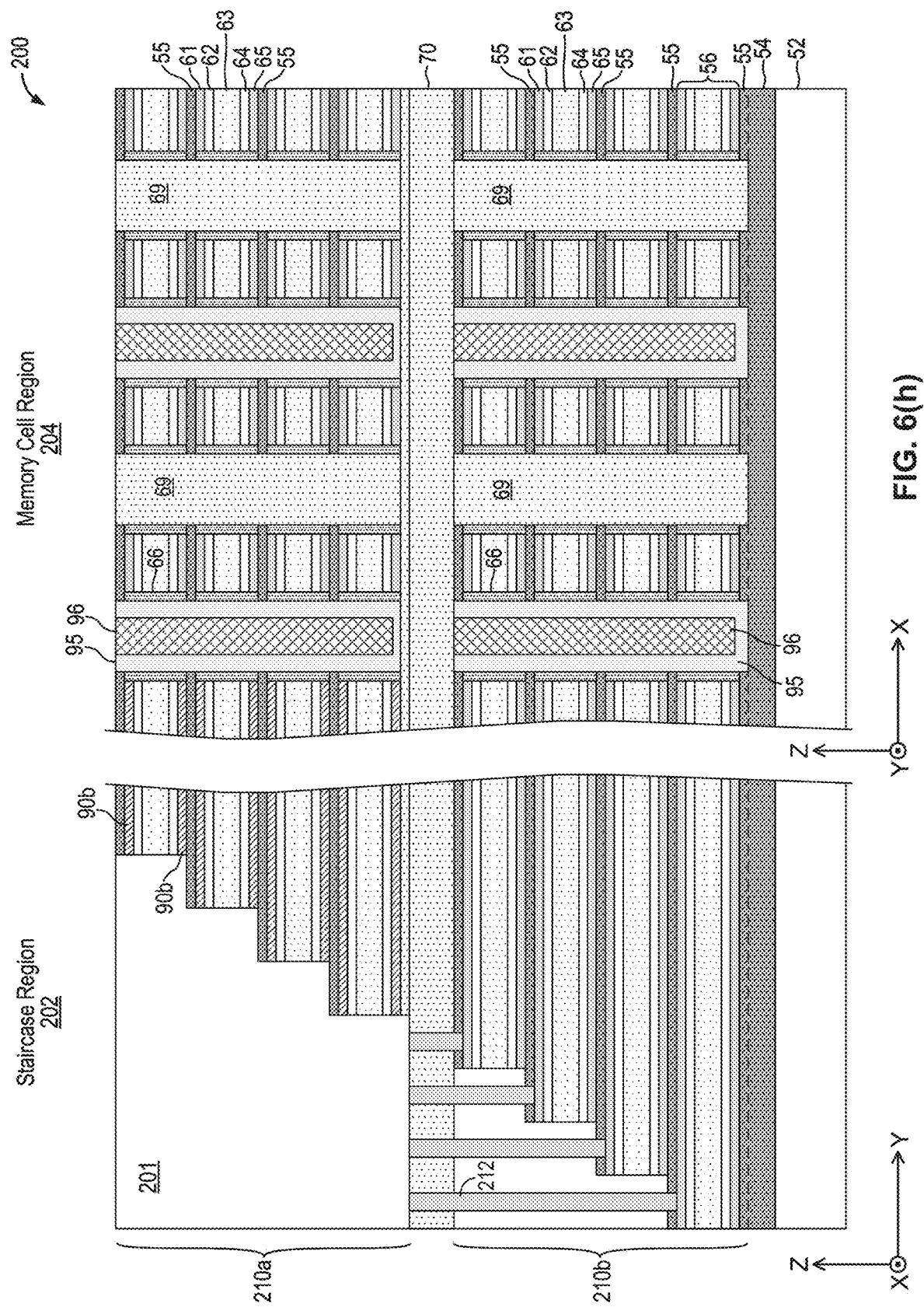

Referring to FIG. 6(g), the method 100 forms the staircase terrace in the staircase region 202 and fill the staircase region with an oxide layer 201. Then, referring to FIG. 6(h), the method 100 forms the first and second set of trenches, forms the channel region 66 and replaces the silicon nitride layers 90a, 90b with conductive layers 61, 65 as described above. The method 100 forms shafts in the dielectric-filled trenches and fills the shafts with the sacrificial trench material to form the LWL structures. For example, the shafts can be filled with a sacrificial silicon oxide liner 95 and a sacrificial amorphous silicon filler 96.

In the present embodiment, the memory structure 200 includes two active stack sections 210a and 210b. Therefore, active stack section 210a is the topmost active stack section. In other embodiments, the memory structure 200 may form additional active stack sections 210 until the desired number of active layers 56 are formed. For instance, at each active stack section, the staircase region is completed by replacing the sacrificial silicon nitride layer with conductive layers and the method forms the buffer oxide layer and the staircase contacts through the buffer oxide layer to the conductive layer 61 of each active layer. The method repeats to form additional active stack sections. At the topmost active stack section 210a, the method 100 proceeds to complete the LWL structures in the sacrificial trench material filled shafts across all of the active stack sections before completing the staircase region in the topmost active stack section 210a.

In each active stack section 210 in the memory structure 200, the sacrificial trench material filled LWL structures are formed aligned with the LWL structures on the other active stack sections. As thus formed, a LWL structure in one active stack section are separated from a corresponding LWL structure in an adjacent active stack section by the buffer oxide layer 70 and other silicon oxide layers, if any. In embodiments of the present disclosure, the LWL structures are formed by removing the sacrificial trench material in the LWL structures and connecting the vertically aligned excavated openings across the P number of active stack sections.

Figure 6I:
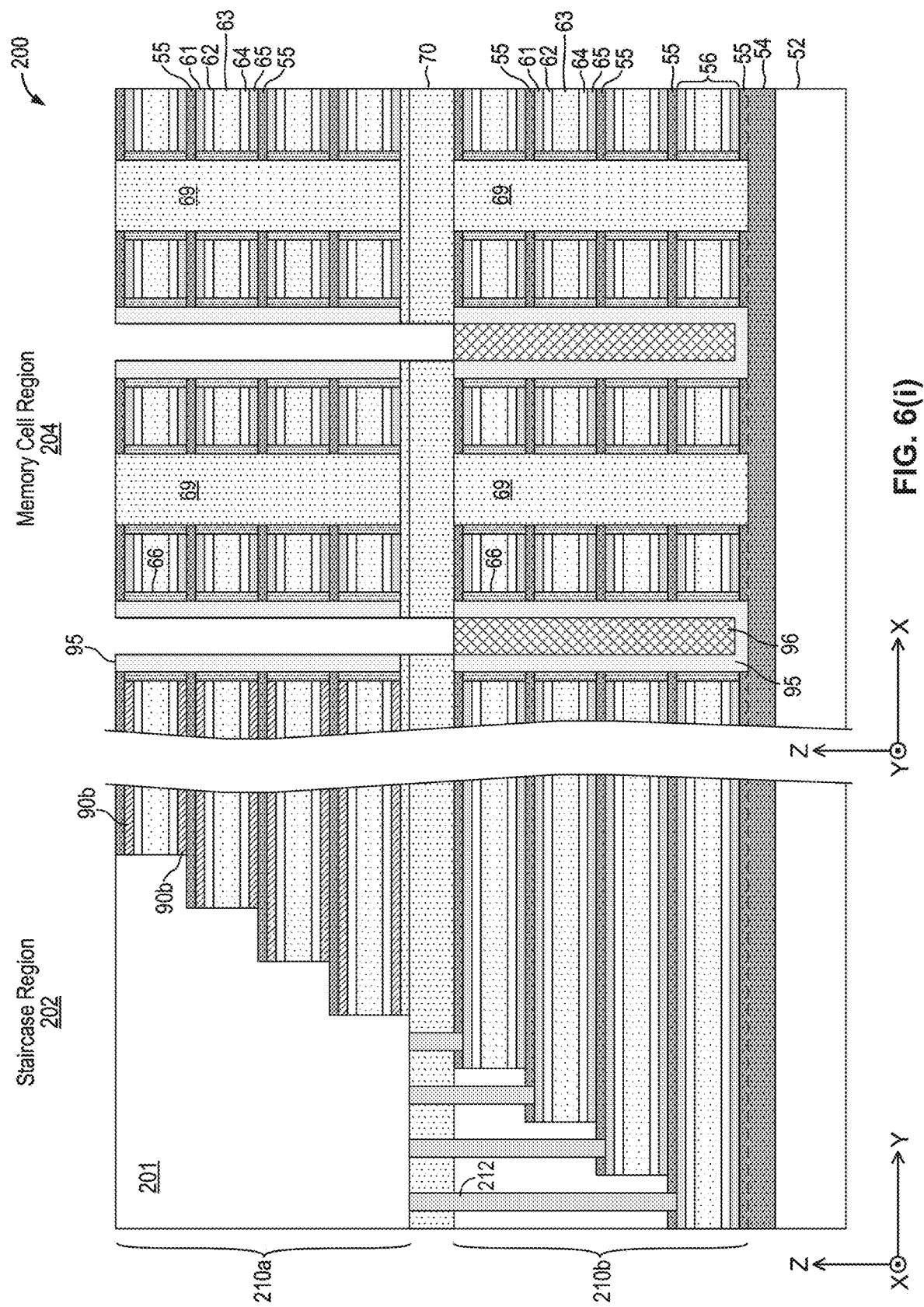
Figure 6I:
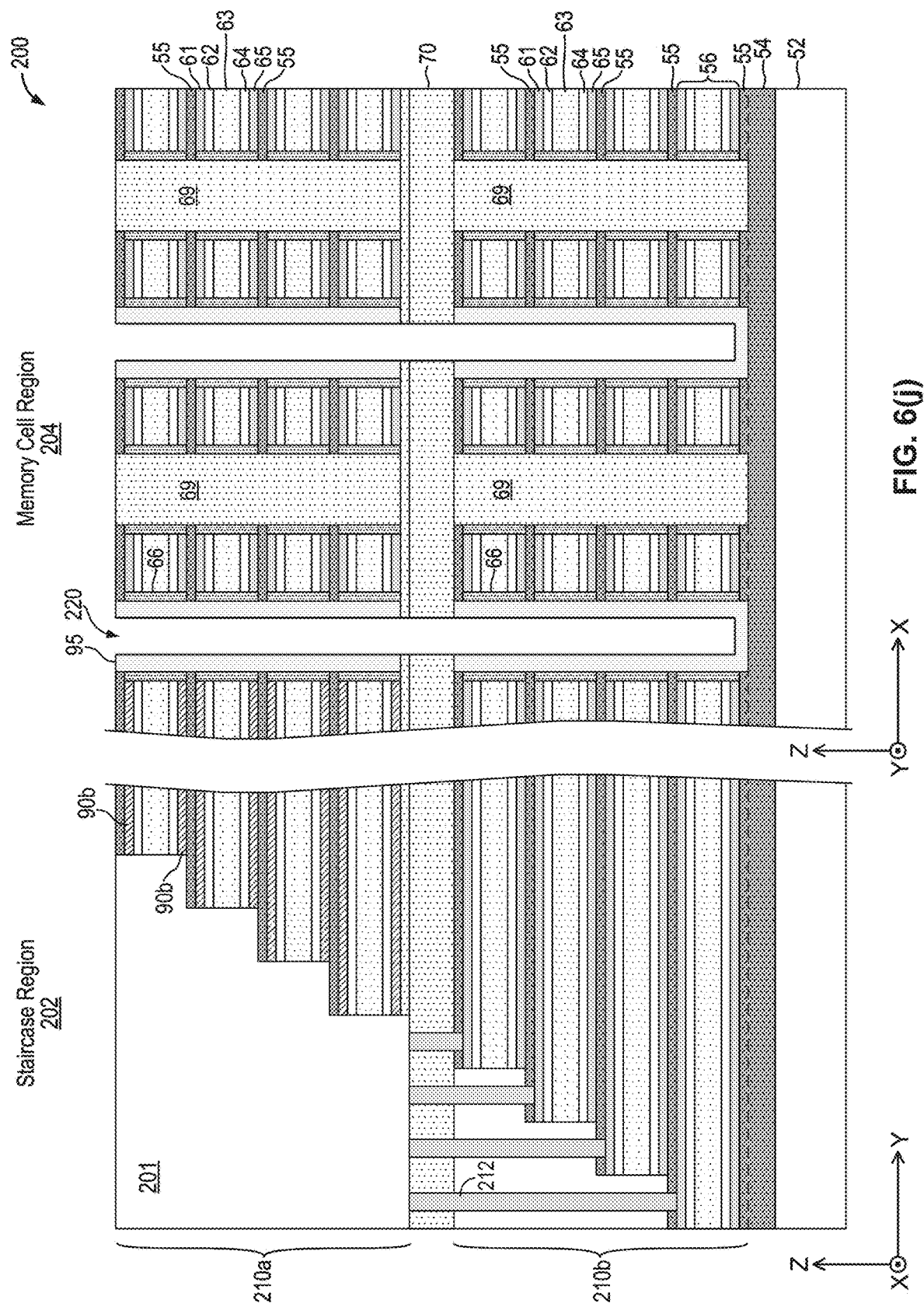
Figure 6K:
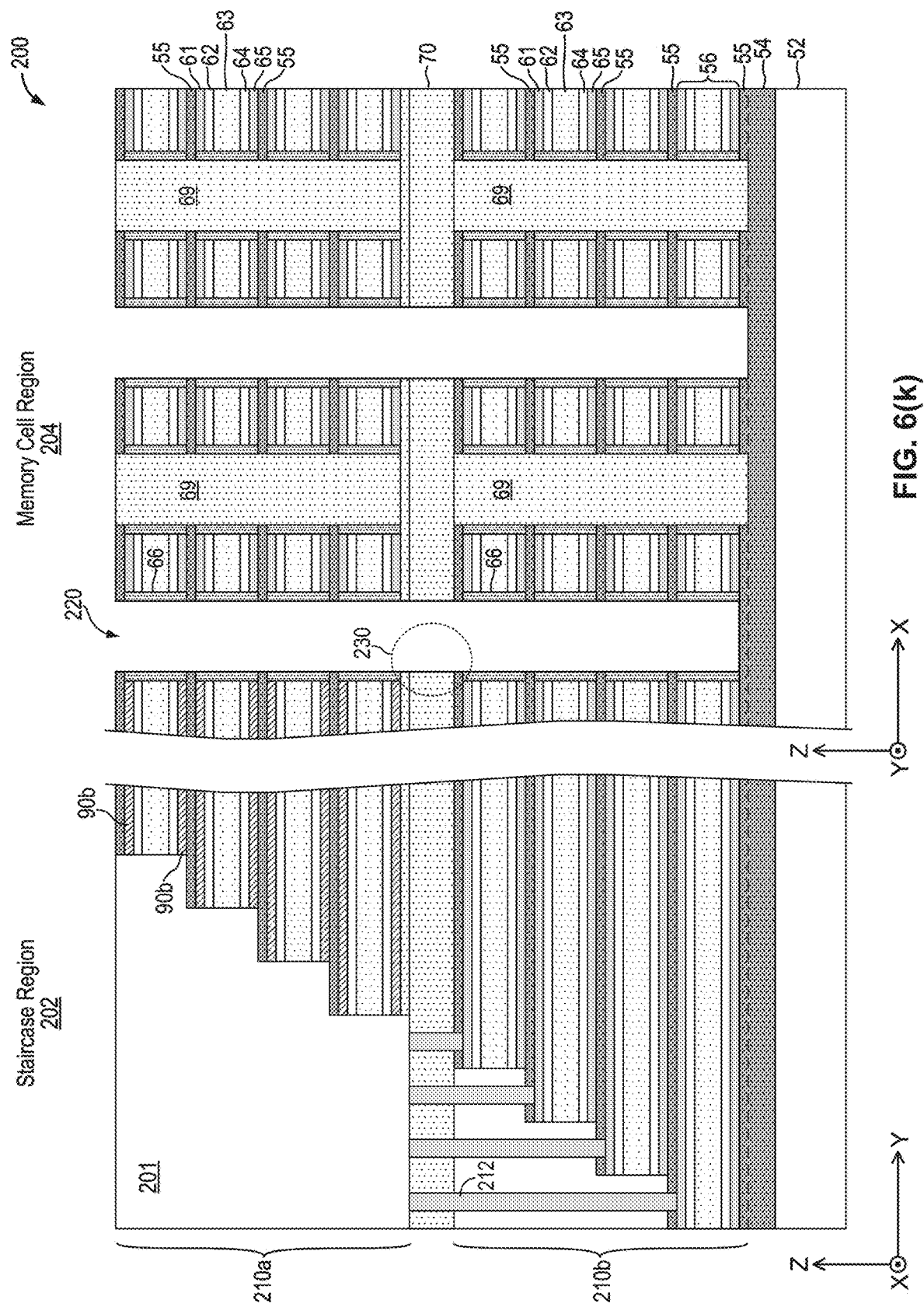
Figure 6I:
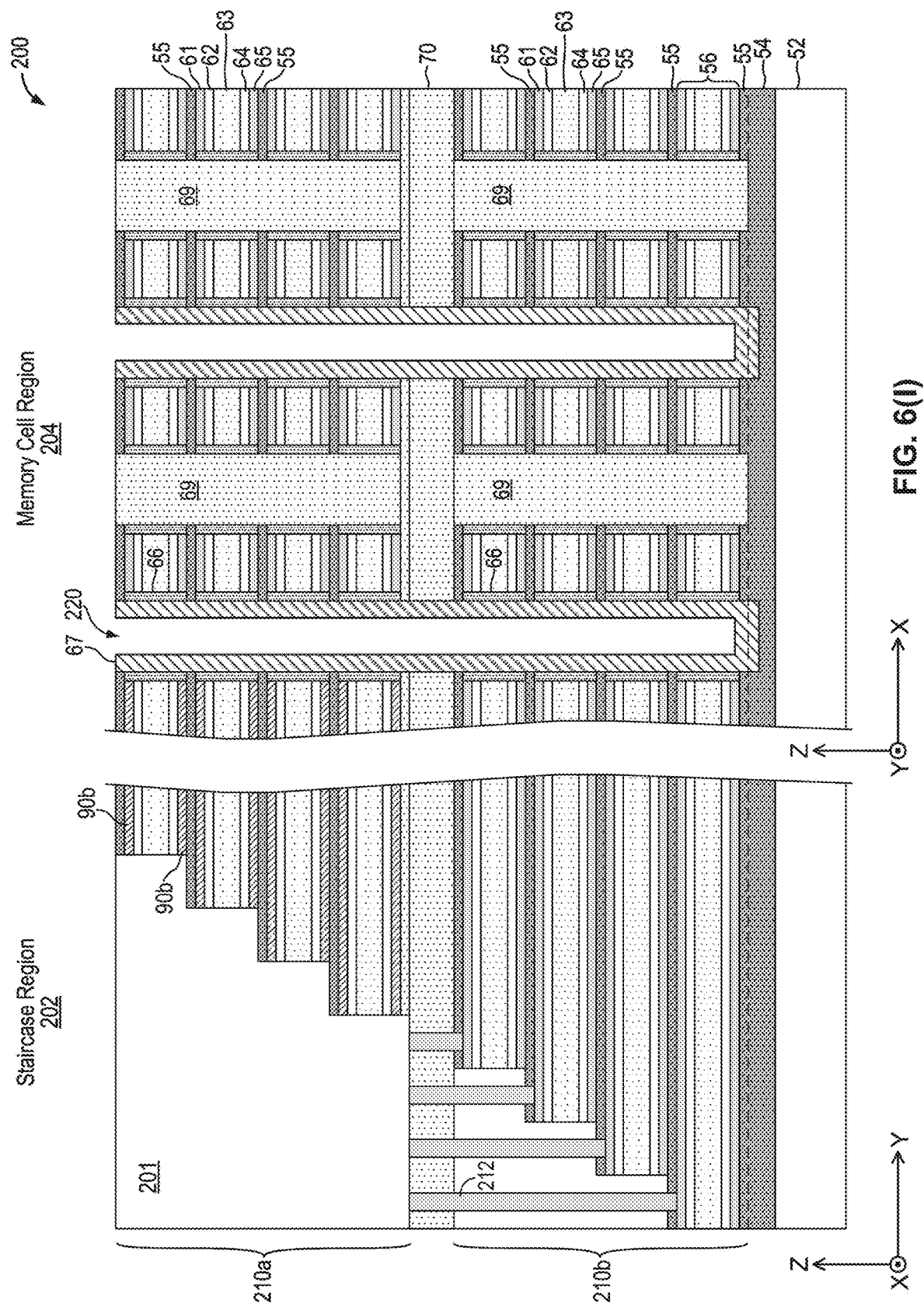

Referring to FIG. 6(i), the method 100 removes the sacrificial amorphous silicon filler 96 from the LWL structures in the topmost active stack section (step 110, FIG. 5). For example, the sacrificial amorphous silicon filler 96 can be removed by a wet etch process. The method 100 then etches through the buffer oxide layer 70, and any other silicon oxide layer, if any, to expose the sacrificial amorphous silicon filler in the LWL structures of the active stack section below. For example, the buffer oxide layer 70 may be etched by a dry etch process. The method 100 then removes the exposed sacrificial amorphous silicon filler in the LWL structures of the below active stack section, such as by a wet etch process. The method 100 repeats the removal of the sacrificial amorphous silicon filler and the etching of the buffer oxide layer between the active stack sections until the sacrificial amorphous silicon filler in the LWL structures of the bottommost active stack section is removed, as shown in FIG. 6(j). The method 100 then removes the sacrificial silicon oxide liner 95 from the excavated openings 220 across all of the active stack sections. For example, the sacrificial silicon oxide liner 95 can be removed by a wet etch process. The resulting memory structure is shown in FIG. 6(k). In some embodiments, the removal of the silicon oxide liner 95 also results in the removal of the overhanging buffer oxide layer 70, denoted by the dotted circle 230.

Referring to FIG. 6(*l*), the method 100 then completes the LWL structures in the excavated openings. At step 112 (FIG. 5), the method 100 forms a charge-storage layer 67 on the sidewalls of the excavated openings 220. In some embodiments, the charge-storage layer 67 is conformally deposited on the exposed sidewalls of the excavated openings 220. In some embodiments, the charge-storage layer 67 is a multi-layer that includes, for example, (i) a 1-nm thick tunneling dielectric layer (e.g., silicon oxide (SiO2)); (ii) a 6-nm thick charge-trapping layer that may be a multilayer that includes zirconium oxide (ZrO), silicon nitride (SiN) and SiO2; and (iii) a 3-nm thick blocking layer (e.g., $Al_2O_3$). The charge-storage layer 67 is sometimes referred to as an "OZNOA" layer. After deposition, the multi-layer structure is annealed to form the charge-storage layer 67. For example, the annealing process for the charge-storage layer can be performed at 850° C. for 1 minute.

In some further embodiments, the tunneling dielectric layer may be any silicon oxide ($SiO_x$), any silicon nitride ($Si_xN_y$), any silicon oxide nitride (SiON), any aluminum oxide ($AlO_x$), any hafnium oxide ($HfO_x$), zirconium oxide ($ZrO_x$), any hafnium silicon oxide ($HfSi_xO_y$), any hafnium zirconium oxide (HfZrO), or any combination thereof. In some further embodiments, the charge-trapping layer may be a single layer or a multilayer and may include any silicon nitride ($Si_xN_y$), hafnium oxide ($HfO_2$), or hafnium silicon oxynitride (HfSiON). The blocking layer may be any silicon oxide ($SiO_x$), aluminum oxide, or both. As known to those of ordinary skill in the art, each of these materials need not be the stoichiometric compounds. For example, the silicon nitride in the charge-trapping layer may be silicon-rich nitride.

At step 114 (FIG. 5), after the deposited charge-storage layer 67 is annealed, a conductive is formed in the excavated openings 220. In some embodiments, the excavated openings 200, lined with the charge-storage layer 67, are filled by a conductive layer 68, as shown in FIG. 6(*m*). The conductive layer may include successively deposited titanium nitride (TiN) liner and tungsten (W) layer. The TiN liner may be formed using, for example, an atomic layer deposition (ALD) technique. The conductive layer 68 provides a vertical local word line (LWL) that serves as gate electrode for each of the storage transistors that are vertically aligned in the same active stack. The structure resulting from the combination of the charge-storage layer 67 and the conductive layer 68 is referred herein as the local word line (LWL) structure. In particular, the gate electrodes and the charge-storage layers are formed as columnar structures extending in the Z-direction where a charge-storage layer encircles a gate electrode in each columnar structure. Excess deposited materials may be removed from the top of memory structure 200 by CMP.

Subsequent to the formation of the LWL structures, the staircase region in the topmost active stack region 210*a* can now be completed (step 116, FIG. 5). Referring to FIG. 6(*n*), the method may form trenches in the staircase region 202 and replaces the first and second sacrificial silicon nitride layers 90*a* and 90*b* in the staircase region 202 of the topmost active stack section with conductive layers 61, 65, such as a titanium nitride (TiN) lined tungsten (W) layer, using the process described above with reference to the memory cell region 204.

Referring to FIG. 6(*o*), subsequent to the forming the LWL structures, an encapsulation dielectric layer 222 is deposited on the topmost active stack section 210*a*. In some embodiments, the encapsulation dielectric layer 222 is a silicon oxide layer. Subsequently, openings are made in the encapsulation dielectric layer 222 and in the oxide layer 201 to form staircase contacts 224. In particular, each staircase contact 224 connects to the conductive layer 61 (the common drain line) of each active layer at the staircase region 202 or connects to a staircase contact 212 from the active stack section below.

Referring to FIG. 6(*p*), the gate electrode 68 of each LWL structure is the local word line which is connected to a conductive layer 75 through conductive vias in the encapsulation dielectric layer 222. The conductors 75 form the global word line of the memory structure 200.

In alternate embodiments, the memory structure can be formed using the inverse LWL process. In that case, the first and second set of trenches are formed and thereafter filled with a silicon oxide liner and a sacrificial material, such as amorphous silicon. Subsequently, the LWL shafts are formed in the trenches and are filled with the dielectric filler material, such as silicon oxide. The LWL structures are to be formed in the regions between the dielectric-filled shafts. After the P active stack sections are formed, the LWL structures can be completed by removing the sacrificial materials (the silicon oxide liner and the amorphous silicon) in the trench between the dielectric-filled shafts. The charge-storage layer and the conductor are formed in the excavated regions across all the active stack sections, as described above with reference to FIGS. 6(*i*) to 6(*p*).

The method of the present disclosure realizes the advantage of forming a three-dimensional memory structure without requiring high aspect-ratio dry etches to form trenches through the entire memory structure. Instead, the three-dimensional memory structure is formed in sections where the aspect-ratio for the trench dry etch process can be kept to a reasonable value. After all the sections are formed, wet etch processes are used to excavate the LWL structures so that no high aspect-ratio dry etch process needs to be performed.

The method of the present disclosure further realizes the advantage of performing the gate dielectric layer formation process only once for P number of active stack sections. In some cases, the gate dielectric layer is a charge-storage layer and the charge-storage layer process requires a high temperature anneal. It is therefore desirable to limit the exposure of the memory structure already formed to the high temperature anneal process. For instance, excessive high temperature processing may result in undesired out-diffusion of dopants from the source and drain regions into the channel region of each storage transistor. The method of the present disclosure uses a sacrificial material in the LWL structure as each active stack section is being formed and then perform the charge-storage layer formation process only once after all of the active stack sections are formed, thereby managing the thermal budget of the fabrication process to a reasonable level.

In alternate embodiments of the present disclosure, the process for fabricating a three-dimensional NOR memory string of storage transistors can be adapted to form a three-dimensional NOR memory string of junctionless ferroelectric memory transistors. In some embodiments, the junctionless ferroelectric memory transistors are thin-film ferroelectric field-effect transistors (FeFETs) having a ferroelectric polarization layer as a gate dielectric layer, the ferroelectric polarization layer being formed adjacent an oxide semiconductor layer as a channel region. The ferroelectric memory transistors include source and drain regions—both formed of a metallic conductive material—in electrical contact with the oxide semiconductor channel region. The semiconductor layers for the source-drain regions are omitted and the ferroelectric memory transistors thus formed are each a junctionless transistor without a p/n junction in the channel. As thus formed, the ferroelectric memory transistor has a threshold voltage that is modulated by the polarization of the mobile carriers in the ferroelectric polarization layer. In some embodiments, the ferroelectric polarization layer is formed of a doped hafnium oxide material and the semiconductor oxide channel region is formed of an amorphous metal oxide semiconductor material.

In some embodiments, the channel layer is formed using an amorphous oxide semiconductor material, such as indium gallium zinc oxide (InGaZnO or IGZO), indium zinc oxide (IZO), indium tungsten oxide (IWO), or indium tin oxide (ITO), or other such semiconductor oxide materials. In some embodiments, the ferroelectric polarization layer is formed of a doped hafnium oxide material, such as zirconium-doped hafnium oxide (HfZrO or "HZO"). In other embodiments, the hafnium oxide can be doped with silicon (Si), iridium (Ir) or lanthanum (La). In some embodiments, the ferroelectric polarization layer, sometimes referred to as a ferroelectric dielectric layer, is a material selected from: zirconium-doped hafnium oxide (HZO), silicon-doped hafnium oxide (HSO), aluminum zirconium-doped hafnium oxide (HfZrAlO), aluminum-doped hafnium oxide (HfO2:Al), lanthanum-doped hafnium oxide (HfO2:La), hafnium zirconium oxynitride (HfZrON), hafnium zirconium aluminum oxide (HfZrAlO), and any hafnium oxide that includes zirconium impurities.

Figure 6M:
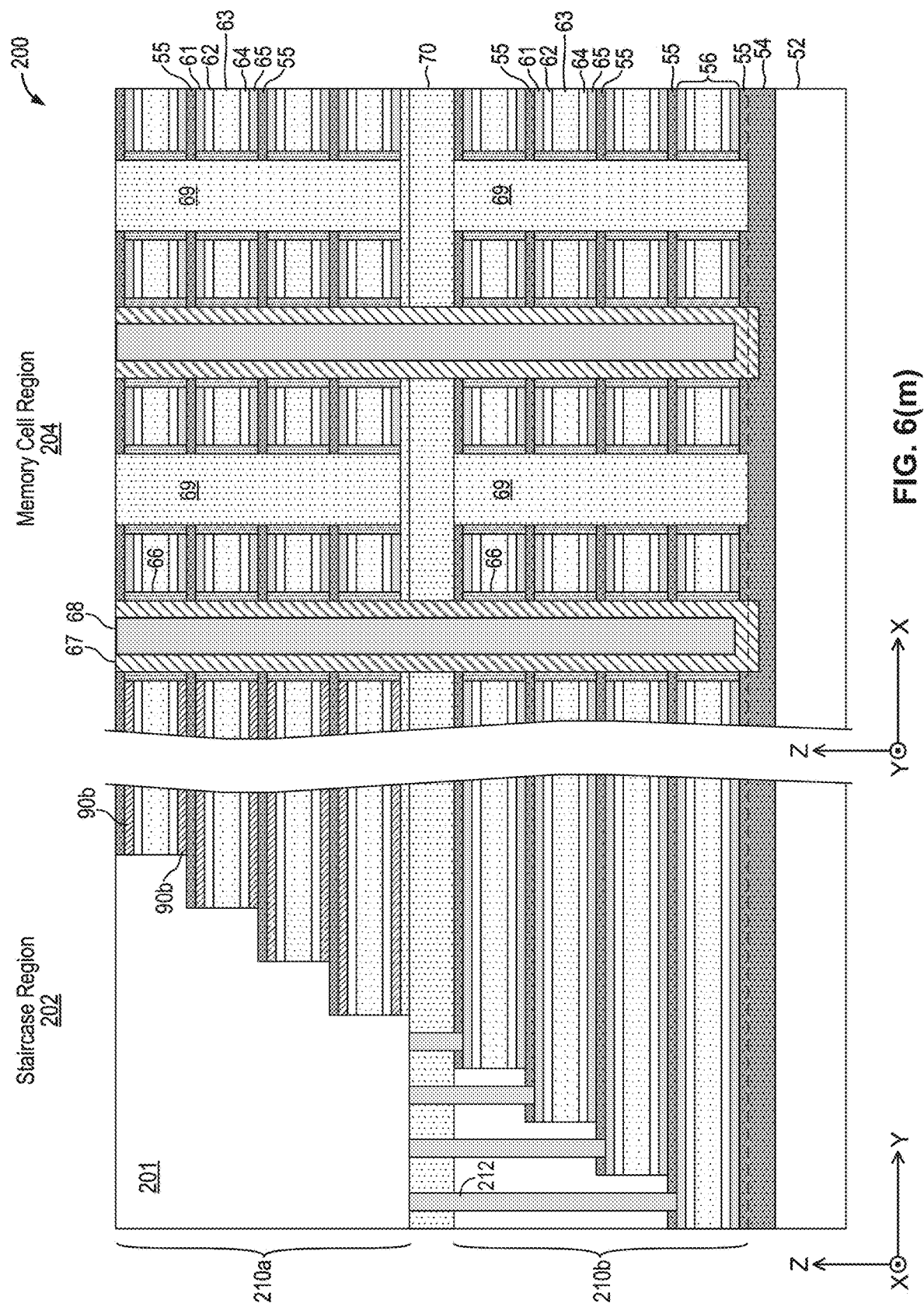
Figure 6N:
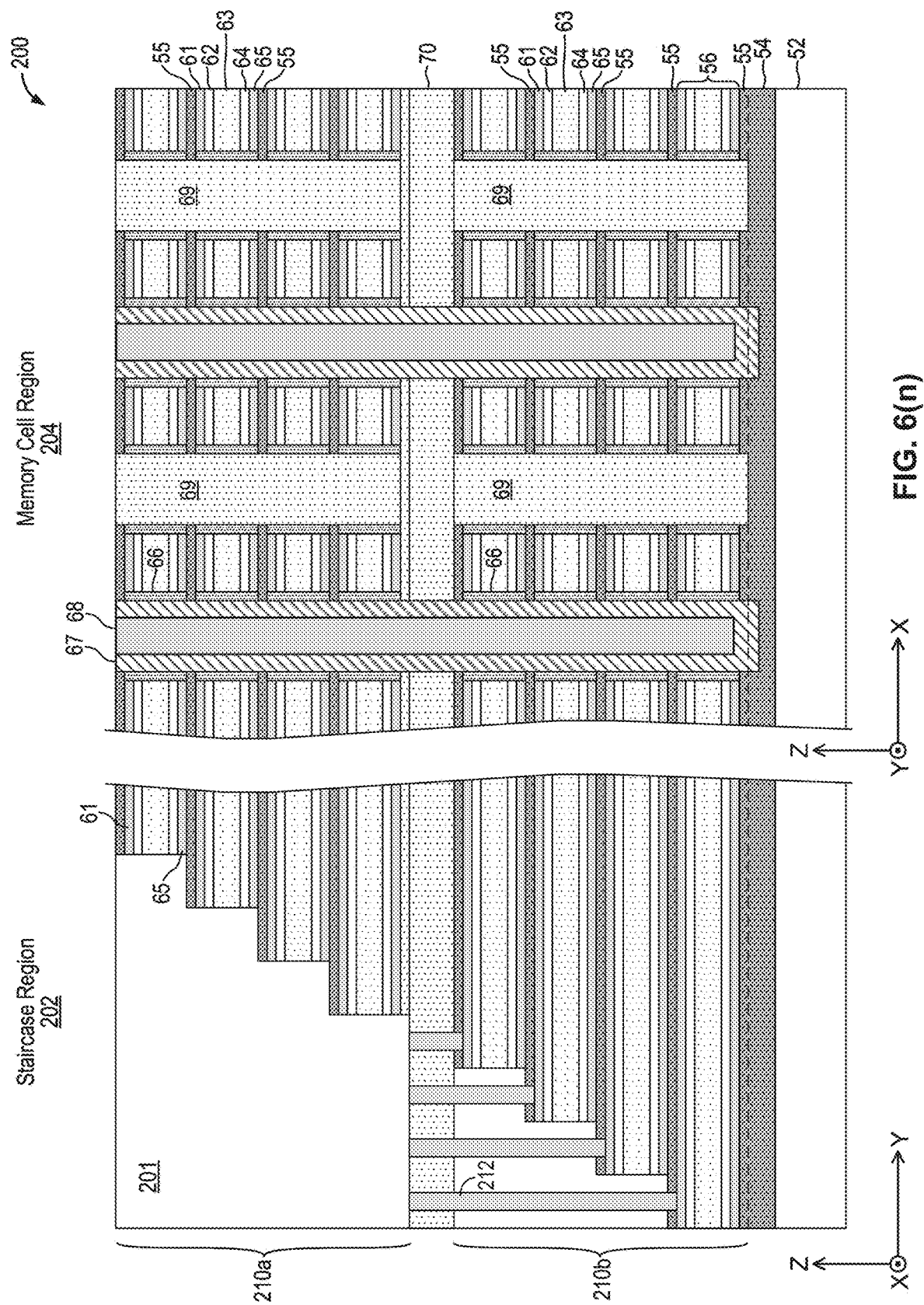
Figure 6O:
Figure 6P:
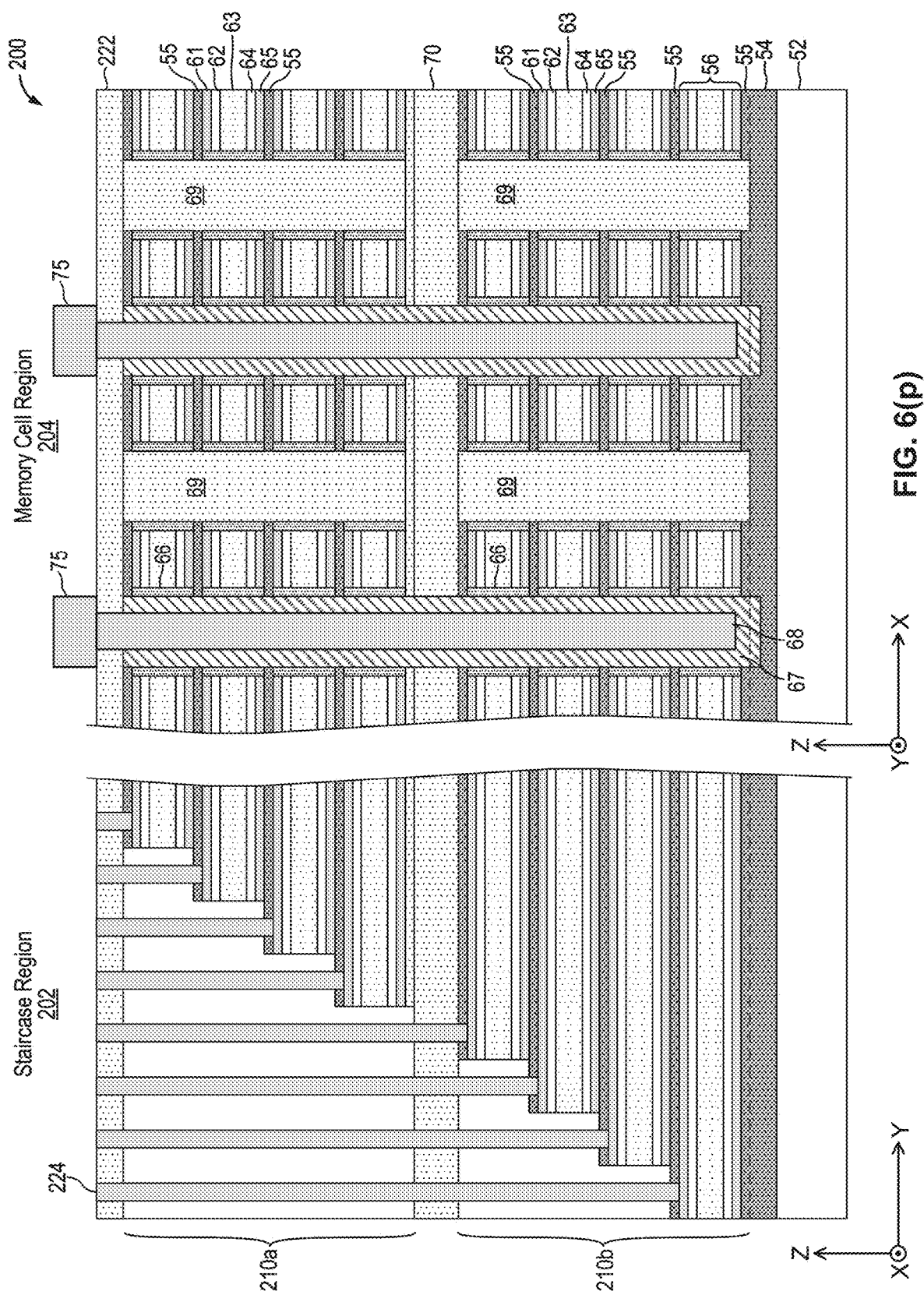

In alternate embodiments, the fabrication process described above can be adapted to form a three-dimensional NOR memory string of junctionless ferroelectric storage transistors. For instance, the method may start with forming N number of multilayers 56 on the planar surface of a semiconductor substrate 52, as shown in FIG. 6(a), where each multilayer 56 includes first and second sacrificial layers 90a and 90b spaced apart by the dielectric layer 63. The semiconductor layers are omitted in the multilayer. The first and second sacrificial layers 90a, 90b are to be replaced by conductive layers in subsequent processing steps. Following the trench formation, an oxide semiconductor material is deposited on the sidewall of the active layer 56 to form the channel region 66. For example, the oxide semiconductor material may be IGZO. Then, after the desired number of active stack sections are formed, the sacrificial amorphous silicon filler and the sacrificial silicon oxide liner are removed from the shafts formed in the narrow trenches in all of the active stack sections, as shown in FIGS. 6(h) to 6(k). Thereafter, a ferroelectric dielectric layer is conformally deposited on the exposed sidewalls of the excavated openings, as shown in FIG. 6(l). That is, the ferroelectric dielectric layer is deposited in place of the charge-storage layer. In one embodiment, the ferroelectric dielectric layer is zirconium-doped hafnium oxide or HZO. The gate conductor is formed in the excavated openings adjacent the ferroelectric dielectric layer to complete the ferroelectric storage transistors, as shown in FIG. 6(m).

In alternate embodiments, the memory structure of junctionless ferroelectric transistors can be formed using the inverse LWL process. In that case, the first and second set of trenches are formed and thereafter filled with a silicon oxide liner and a sacrificial material, such as amorphous silicon. Subsequently, the LWL shafts are formed in the trenches and are filled with the dielectric filler material, such as silicon oxide. The LWL structures are to be formed in the regions between the dielectric-filled shafts. After the P active stack sections are formed, the LWL structures can be completed by removing the sacrificial materials (the silicon oxide liner and the amorphous silicon) in the trench between the dielectric-filled shafts. The ferroelectric dielectric layer and the conductor are formed in the excavated sections across all the active stack sections, as described above with reference to FIGS. 6(i) to 6(p).

In this detailed description, various embodiments or examples of the present invention may be implemented in numerous ways, including as a process; an apparatus; a system; and a composition of matter. A detailed description of one or more embodiments of the invention is provided above along with accompanying figures that illustrate the principles of the invention. The invention is described in connection with such embodiments, but the invention is not limited to any embodiment. Numerous modifications and variations within the scope of the present invention are possible. The scope of the invention is limited only by the claims and the invention encompasses numerous alternatives, modifications, and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured. The present invention is defined by the appended claims.

The invention claimed is:

1. A process suitable for use in fabricating a memory structure comprising storage transistors of a NOR memory string above a planar surface of a semiconductor substrate, the process comprising:

above the planar surface, forming an active stack section comprising repeatedly depositing, alternately and one over another, a multilayer and an isolation dielectric layer, each multilayer comprising first and second semiconductor layers of a first conductivity type, and a dielectric layer between the first and the second semiconductor layers;

forming a plurality of trenches in the active stack section to divide the multilayers into a plurality of stacks of multilayer strips, each stack being separated from an adjacent stack by one of the trenches;

forming a third semiconductor layer of a second conductivity type, opposite the first conductivity type, on sidewall of the trenches adjacent each multilayer and in contact with the first and the second semiconductor layers;

filling the plurality of trenches with a dielectric filler material and forming in each trench a plurality of shafts, the shafts being formed between the dielectric filler material;

depositing into each shaft a sacrificial material;

depositing a dielectric buffer layer on the active stack section;

repeatedly forming the active stack section with the sacrificial material-filled shafts and the dielectric buffer layer, alternately and one over another, to form a plurality of active stack sections separated by the dielectric buffer layers between adjacent active stack sections, each sacrificial material-filled shaft in one active stack section being in alignment with the sacrificial material-filled shafts in adjacent active stack sections;

removing the sacrificial material from the shafts of the plurality of active stack sections and removing portions of the dielectric buffer layer situated between the shafts of adjacent active stack sections to form buffer layer openings; and forming in the shafts and the buffer layer openings a charge-storage layer and a conductor.

2. The process of claim 1, wherein forming the plurality of trenches in the active stack section to divide the multilayers into the plurality of stacks of multilayer strips comprises:

cutting the plurality of trenches into the multilayers and the isolation dielectric layers of the active stack section, thereby (1) exposing the dielectric layers, the first and second semiconductor layers and the isolation dielectric layers at the sidewalls of the trenches, each trench having (i) a depth that extends along a first direction that is normal to the planar surface, (ii) a length that extends along a second direction that is parallel to the planar surface, (iii) a width that extends along a third direction that is orthogonal to the depth and the length, the length of the trench being greater than its width; and (2) dividing the multilayers into a plurality of stacks of multilayer strips, each stack being separated from an adjacent stack by the width of one of the trenches, with each multilayer strip being the portion of a multilayer between adjacent trenches.

3. The process of claim 2, wherein forming in the shafts and the buffer layer openings a charge-storage layer and a conductor comprises:

forming the charge-storage layer along the sidewalls of the shafts and the buffer layer openings, the charge-storage layer being discontinuous at or near the buffer layer openings along the depth of the shafts across the plurality of active stack sections; and subsequent to forming the charge-storage layer, forming the conductor in the shafts and the buffer layer openings, the conductor being continuous along the depth of the shafts and the buffer layer openings across the plurality of active stack sections.

4. The process of claim 1, wherein depositing into each shaft the sacrificial material comprises:

depositing into each shaft a silicon oxide liner layer as a first sacrificial material, the silicon oxide liner layer lining the sidewalls of the shafts; and depositing into each shaft an amorphous silicon layer as a second sacrificial material to fill each shaft.

5. The process of claim 1, wherein removing the sacrificial material from the shafts of the plurality of active stack sections and removing portions of the dielectric buffer layer situated between the shafts of adjacent active stack sections to form buffer layer openings comprises:

removing the sacrificial material from the shafts of the topmost active stack section;

removing the portions of the dielectric buffer layer situated below the shafts exposed by the removed sacrificial material;

removing the sacrificial material from the shafts of the active stack section beneath the topmost active stack section and removing the portions of the dielectric buffer layer situated below the shafts exposed by the removed sacrificial material; and continuing to remove the sacrificial material from the shafts of the active stack section and the portions of the dielectric buffer layer exposed by the removed sacrificial material until the sacrificial material is removed from the bottommost active stack section.

6. The process of claim 4, wherein removing the sacrificial material from the shafts of the plurality of active stack sections and removing portions of the dielectric buffer layer situated between the shafts of adjacent active stack sections to form buffer layer openings comprises:

removing the amorphous silicon layer from the shafts of the topmost active stack section;

removing the portions of the dielectric buffer layer situated below the shafts exposed by the removed amorphous silicon layer to form the buffer layer openings;

removing the amorphous silicon layer from the shafts of the active stack section beneath the topmost active stack section and removing the portions of the dielectric buffer layer situated below the shafts exposed by the removed amorphous silicon layer;

continuing to remove the amorphous silicon layer from the shafts of the active stack section and the portions of the dielectric buffer layer exposed by the removed amorphous silicon layer until the amorphous silicon layer is removed from the bottommost active stack section; and removing the silicon oxide liner layer from the shafts of the plurality of active stack sections.

7. The process of claim 1, wherein depositing the dielectric buffer layer on the active stack section comprising:

depositing a silicon oxide buffer layer on the active stack section.

8. The process of claim 1, wherein each active stack section comprises a N number of multilayers, the plurality of active stack sections comprises P number of active stack sections, and the memory structure comprises K number of multilayers, K being the product of N and P.

9. The process of claim 1, wherein forming the charge-storage layer comprises forming a tunneling dielectric layer, a charge-trapping layer and a blocking layer as the charge-storage layer.

10. The process of claim 9, wherein forming the charge-storage layer comprises:

forming the tunneling dielectric layer comprising forming any one of silicon oxide ($SiO_x$), silicon nitride ($Si_xN_y$), silicon oxide nitride (SiON), aluminum oxide ($AlO_x$), hafnium oxide ($HfO_x$), zirconium oxide ($ZrO_x$), hafnium silicon oxide ($HfSi_xO_y$), hafnium zirconium oxide (HfZrO), or any combination thereof;

forming the charge-trapping layer comprising forming any one or more of silicon nitride ($Si_xN_y$), hafnium oxide ($HfO_2$), or hafnium silicon oxynitride (HfSiON); and forming the blocking layer comprises forming any one or more of silicon oxide ($SiO_x$) and aluminum oxide.

11. The process of claim 1, wherein forming the conductor comprises forming a titanium nitride-lined tungsten layer as the conductor.

12. The process of claim 1, wherein the isolation dielectric layer comprises silicon oxycarbide.

13. The process of claim 1, wherein the first and the second semiconductor layers of the first conductivity type each comprises a heavily doped n-type polysilicon layer and the third semiconductor layer of the second conductivity type comprises a lightly doped p-type polysilicon layer.

14. The process of claim 1, wherein each multilayer further comprises first and second conductive layers, the first conductive layer being formed next to the first semiconductor layer away from the dielectric layer and the second conductive layer being formed next to the second semiconductor layer away from the dielectric layer.

15. The process of claim 14, wherein each of the first and second conductive layers comprises a titanium nitride-lined tungsten layer.

16. The process of claim 1, wherein the charge-storage layer and the conductor in each shaft form a local word line structure, wherein the local word line structures in a first trench are positioned staggered from the local word line structures in a second trench adjacent the first trench.

17. The process of claim 1, wherein the charge-storage layer and the conductor in each shaft form a local word line structure, and the process further comprising:
   forming an encapsulation dielectric layer on the topmost active stack section;
   forming openings in the encapsulation dielectric layer exposing at least the conductors formed in the shafts;
   forming conductive vias in the openings, each conductive via being in contact with a conductor in a local word line structure; and
   forming global word line conductors in a third conductive layer formed on the encapsulation dielectric layer, each global word line conductor being in contact with at least one of the conductive vias.

18. The process of claim 1, wherein forming in each trench the plurality of shaft between the dielectric filler material and depositing into each shaft the sacrificial material comprises:
   filling the plurality of trenches with the dielectric filler material;
   forming a plurality of openings in the dielectric filler material of each trench, the openings being the shafts; and
   depositing into each shaft the sacrificial material.

19. The process of claim 18, wherein the dielectric filler material comprises silicon oxide and the sacrificial material comprises a silicon oxide liner and an amorphous silicon material.

20. The process of claim 1, further comprising:
   subsequent to forming the active stack section, patterning and etching a portion of the active stack section to form a staircase structure in the multilayer, the staircase structure being enclosed by a dielectric filler layer;
   subsequent to depositing the dielectric buffer layer on the active stack section, forming staircase contacts in the dielectric buffer layer and the dielectric filler layer; and
   repeatedly forming the staircase structure and the staircase contacts in each of the plurality of active stack sections, wherein a staircase contact in each active stack section is in contact with either the first semiconductor layer or a conductive layer associated thereto on one step of the staircase structure or with a staircase contact formed in an adjacent active stack sections.

21. The process of claim 20, wherein forming the staircase contacts comprises forming tungsten-filled via in the dielectric buffer layer and the dielectric filler layer.

* * * * *